US009543346B2

(12) United States Patent
Nomura

(10) Patent No.: US 9,543,346 B2
(45) Date of Patent: Jan. 10, 2017

(54) IMAGING ELEMENT AND IMAGING DEVICE

(71) Applicant: SONY CORPORATION, Tokyo (JP)

(72) Inventor: Hirotoshi Nomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 14/778,828

(22) PCT Filed: Mar. 20, 2014

(86) PCT No.: PCT/JP2014/057704
§ 371 (c)(1),
(2) Date: Sep. 21, 2015

(87) PCT Pub. No.: WO2014/156933
PCT Pub. Date: Oct. 2, 2014

(65) Prior Publication Data
US 2016/0049430 A1    Feb. 18, 2016

(51) Int. Cl.
*H01L 27/146*    (2006.01)
(52) U.S. Cl.
CPC ....... *H01L 27/1463* (2013.01); *H01L 27/1464* (2013.01); *H01L 27/14621* (2013.01); *H01L 27/14623* (2013.01); *H01L 27/14625* (2013.01); *H01L 27/14627* (2013.01)
(58) Field of Classification Search
CPC ............... H01L 27/146; H01L 27/1464; H01L 27/1427; H01L 27/14607; H01L 27/1463; H01L 27/14623; H01L 27/14627
See application file for complete search history.

(56) References Cited

U.S. PATENT DOCUMENTS

| | | | |
|---|---|---|---|
| 8,988,576 B2* | 3/2015 | Itou | H04N 5/23212 250/208.1 |
| 2010/0201834 A1* | 8/2010 | Maruyama | H01L 27/1464 348/222.1 |

(Continued)

FOREIGN PATENT DOCUMENTS

| | | |
|---|---|---|
| JP | 2008-071920 | 3/2008 |
| JP | 2008-522245 | 6/2008 |

(Continued)

OTHER PUBLICATIONS

International Search Report prepared by the Japanese Patent Office on Apr. 14, 2014, for International Application No. PCT/JP2014/057704.

*Primary Examiner* — Jerome Jackson, Jr.
(74) *Attorney, Agent, or Firm* — Sheridan Ross P.C.

(57) ABSTRACT

An imaging element according to the present disclosure includes: a first pixel and a second pixel each including a light receiving section and a light condensing section, in which the light receiving section includes a photoelectric conversion element, and the light condensing section is configured to allow entering light to be condensed toward the light receiving section; a trench provided between the first pixel and the second pixel; a first light shielding film embedded in the trench; and a second light shielding film provided on part of a light receiving surface of the light receiving section of the second pixel, in which the second light shielding film is continuous with the first light shielding film.

9 Claims, 18 Drawing Sheets

(56) References Cited

U.S. PATENT DOCUMENTS

2012/0104478 A1* 5/2012 Masuoka .......... H01L 27/14629
    257/292
2013/0070131 A1* 3/2013 Ohkubo ............ H01L 27/14623
    348/294

FOREIGN PATENT DOCUMENTS

| JP | 2010-186818 A | 8/2010 |
| JP | 2011-3860 A | 1/2011 |
| JP | 2011-054350 | 3/2011 |
| JP | 2012-84816 A | 4/2012 |
| JP | 2012-178457 A | 9/2012 |

* cited by examiner

IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2014/057704 having an international filing date of Mar. 20, 2014, which designated the United States, which PCT application claimed the benefit of Japanese Patent Application No. 2013-073532 filed Mar. 29, 2013, the disclosures of which are incorporated herein by reference in their entirety.

TECHNICAL FIELD

The present disclosure relates to an imaging element having a focus detecting function and an imaging device including the imaging element.

BACKGROUND ART

Video cameras, digital still cameras, etc. utilize semiconductor imaging devices (imaging devices) configured of image sensors such as CCD (Charge Coupled Device), CMOS (Complementary Metal-Oxide Semiconductor), etc. In these imaging devices, each element is provided with a light receiving section including a photodiode. In the light receiving section, entering light is photoelectrically converted to generate signal charges.

In recent years, there has been developed a system (an imaging surface phase difference detection system) in which some of imaging pixels in the imaging device are used for phase detection so as to increase an automatic focusing (AF) speed. The phase difference detection system involves focus detection of a pupil division system with use of a two-dimensional sensor in which each pixel of an image sensor is provided with an on-chip lens.

In such an imaging device, some reports have been made on techniques to attain light receiving characteristics expected in pixels for imaging (imaging pixels) and in pixels for focus detection (imaging surface phase difference pixels). For example, an imaging device is disclosed in which curvatures of on-chip lenses are varied, or a placement surface of the on-chip lens is allowed to be at a different level, pixel by pixel, in a direction of an optical axis, so as to adjust a condensing point of entering light (for example, refer to Patent Literatures 1 and 2). Also, an imaging device is disclosed in which an element isolation layer made of a non-transparent conductive material is provided on a rear surface side of a silicon substrate on a light entering side, allowing for improvement in both pupil division performance and sensitivity (for example, refer to Patent Literature 3). Furthermore, an imaging device is disclosed in which one on-chip lens is assigned to a plurality of imaging surface phase difference pixels whose light receiving surfaces are allowed to be at a different level (for example, refer to Patent Literature 4).

CITATION LIST

Patent Literature

Patent Literature 1: JP 2008-522245W
Patent Literature 2: JP 2011-54350A
Patent Literature 3: JP 2012-84816A
Patent Literature 4: JP 2008-71920A

SUMMARY OF INVENTION

However, varying the curvatures of the on-chip lenses or allowing light receiving surfaces of the imaging pixels to be at a different level from those of the imaging surface phase difference pixels may cause a disadvantage of occurrence of color mixture due to obliquely entering light through adjacent pixels, in spite of improvement in AF characteristics.

It is therefore desirable to provide an imaging element and an imaging device that make it possible to improve phase difference detection accuracy while restraining color mixture between adjacent pixels.

An imaging element according to an embodiment of the present technology includes: a first pixel and a second pixel each including a light receiving section and a light condensing section, in which the light receiving section includes a photoelectric conversion element, and the light condensing section is configured to allow entering light to be condensed toward the light receiving section; a trench provided between the first pixel and the second pixel; a first light shielding film embedded in the trench; and a second light shielding film provided on part of a light receiving surface of the light receiving section of the second pixel, in which the second light shielding film is continuous with the first light shielding film.

An imaging device according to an embodiment of the present technology includes the above-described imaging element according to the present technology.

In the imaging element according to the above-described embodiment of the present technology, the first pixel (an imaging pixel) and the second pixel (an imaging surface phase difference pixel) each includes the light receiving section and the light condensing section. The light receiving section includes the photoelectric conversion element. The light condensing section is configured to allow entering light to be condensed toward the light receiving section. Between the adjacent pixels, i.e., the first pixel and the second pixel, provided is the trench in which the first light shielding film is embedded. The first light shielding film is formed continuously with the second light shielding film provided on part of the light receiving surface of the second pixel. This allows for reduction in inter-pixel crosstalk caused by obliquely entering light, while allowing entering light in the second pixel to be condensed at a position where the second light shielding film is formed.

According to the imaging element according to the embodiment of the present technology, the trench is provided between the first pixel and the second pixel. The first light shielding film is embedded in the trench. The first light shielding film is continuous with the second light shielding film provided on part of the light shielding surface of the second pixel. This allows for reduction in crosstalk caused by obliquely entering light through adjacent pixels, while allowing entering light in the second pixel to be condensed at a position where the second light shielding film is formed. Hence, it is possible to improve phase difference detection speed while restraining color mixture between adjacent pixels.

DESCRIPTION OF EMBODIMENTS

In the following, some embodiments of the present disclosure will be described in detail with reference to the drawings. It is to be noted that description will be made in the following order.

1. First Embodiment (a backside illuminated image sensor; an example with a light shielding film for pupil division formed on a light receiving section)
2. Modification Example 1 (an example with the light shielding film for pupil division embedded in the light receiving section)
3. Second Embodiment (a surface illuminated image sensor; an example with the light shielding film for pupil division formed on the light receiving section)
4. Modification Example 2 (an example with the light shielding film for pupil division embedded in the light receiving section)
5. Modification Example 3 (an example with an inner lens)
6. Application Examples (examples of application to electronic apparatuses)

1. First Embodiment

Figure 1:
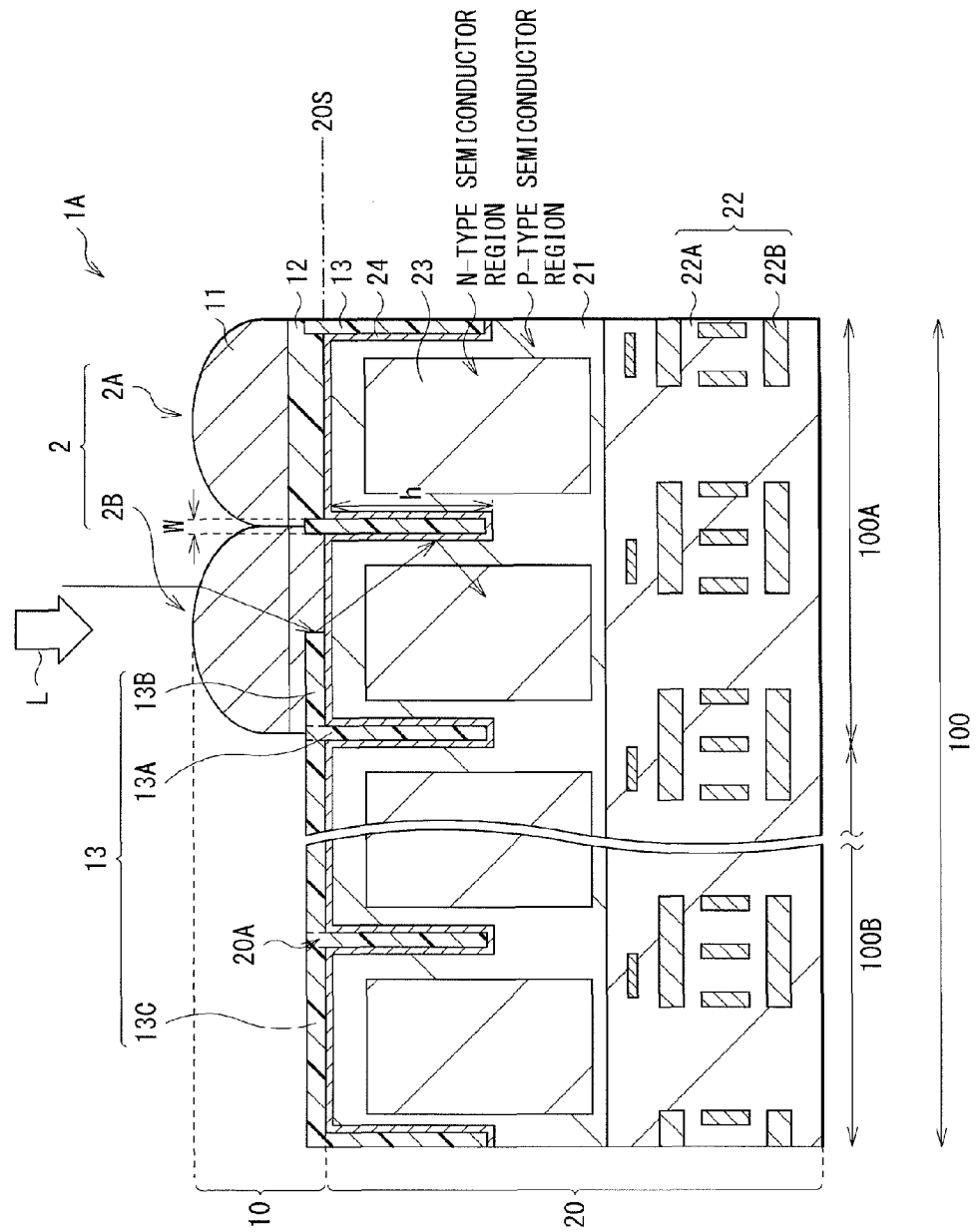
FIG. 1 is a cross-sectional view of an image sensor according to a first embodiment of the present disclosure.
Figure 2:
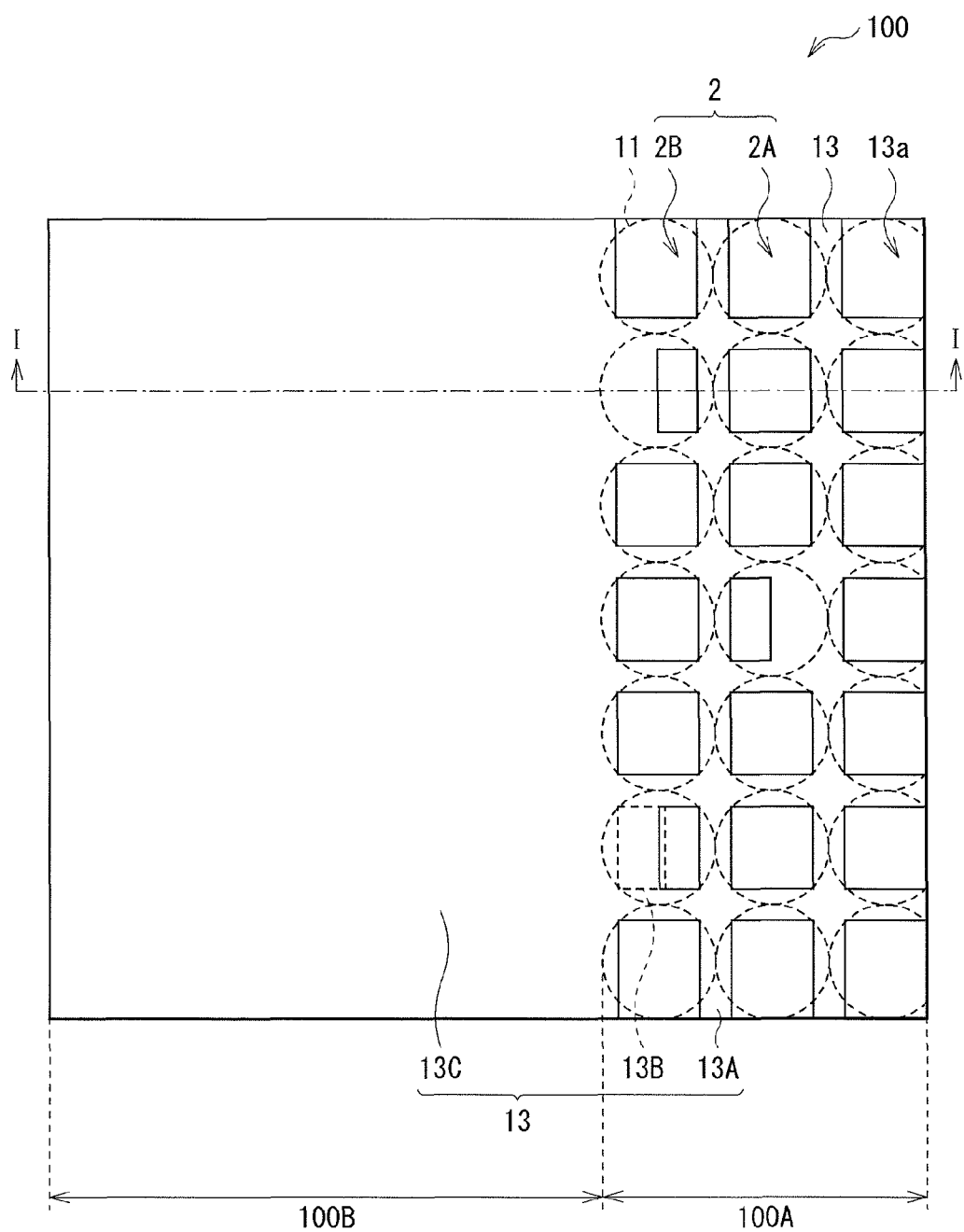
FIG. 2 is a plan view of the image sensor illustrated in FIG. 1.

FIG. 1 illustrates a cross-sectional configuration of an image sensor (an image sensor 1A) according to a first embodiment of the present disclosure. The image sensor 1A may be, for example, a backside illuminated (backside light receiving) solid state imaging element (CCD or CMOS), and may include a plurality of pixels 2 two-dimensionally arrayed as illustrated in FIG. 2 on a substrate 21 (refer to FIG. 3). It is to be noted that FIG. 1 illustrates a cross-sectional configuration along a line I-I illustrated in FIG. 2. The pixels 2 may be configured of an imaging pixel 2A (a first pixel) and an imaging surface phase difference pixel 2B (a second pixel). In the present embodiment, trenches 20A may be provided between the pixels 2, i.e., between the imaging pixel 2A and the imaging surface phase difference pixel 2B adjacent to each other, between the imaging pixel 2A and the imaging pixel 2A adjacent to each other, and between the imaging surface phase difference pixel 2B and the imaging surface phase difference pixel 2B adjacent to each other. In the trench 20A between the imaging pixel 2A and the imaging surface phase difference pixel 2B, a light receiving film 13A (a first light receiving film) is embedded. The light receiving film 13A is continuous with a light receiving film 13B (a second light receiving film) for pupil division in the imaging surface phase difference pixel 2B.

Figure 3A:
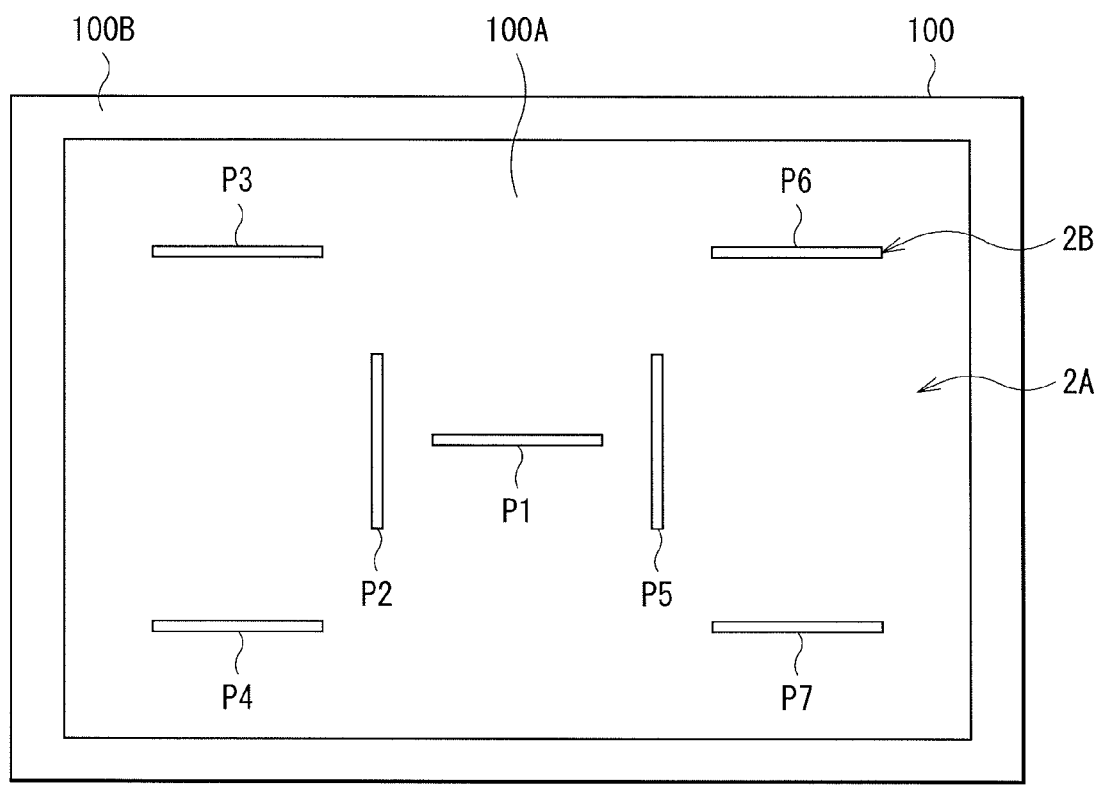
FIG. 3A is a plan view schematically illustrating another layout configuration in the image sensor according to the first embodiment of the present disclosure.
Figure 3B:
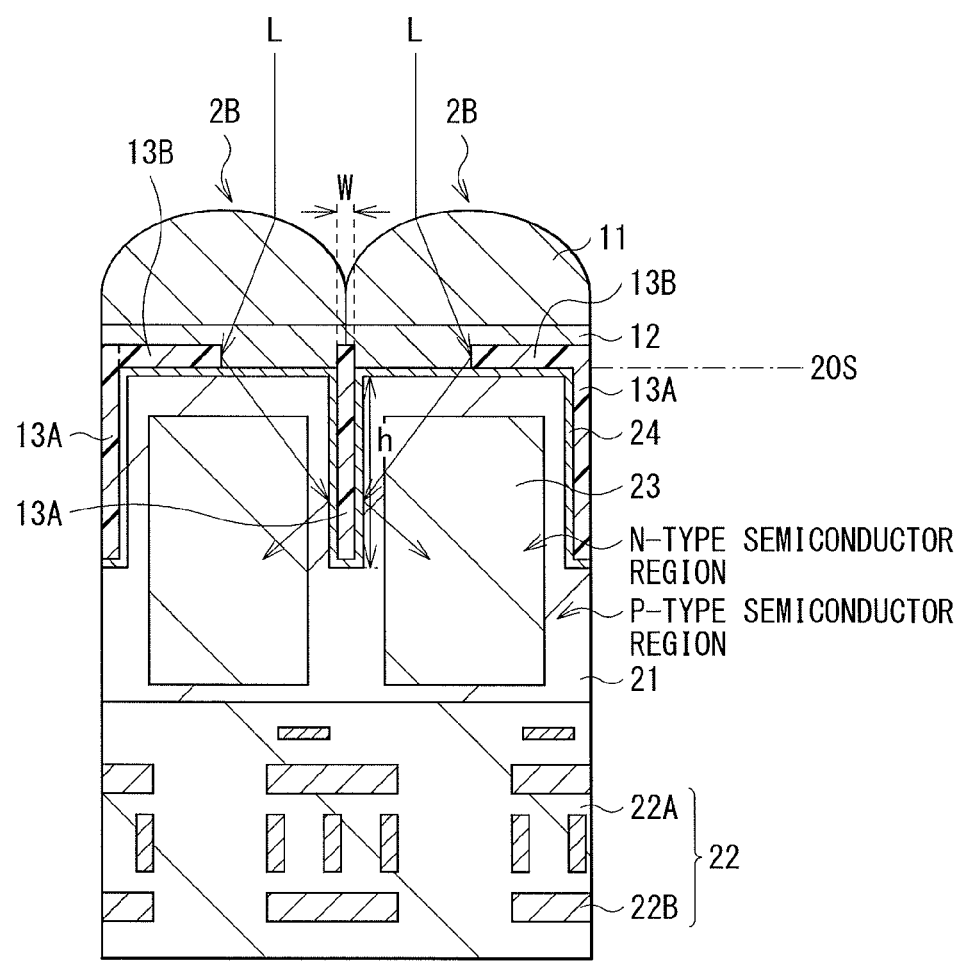
FIG. 3B is a cross-sectional view illustrating a configuration of a main part in a case with a pair of imaging surface phase difference pixels disposed adjacently to each other.

The imaging pixel 2A and the imaging surface phase difference pixel 2B each includes a light receiving section 20 and a light condensing section 10. The light receiving section 20 includes a photoelectric conversion element (a photodiode 23). The light condensing section 10 is configured to allow entering light to be condensed toward the light receiving section 20. The imaging pixel 2A is configured to allow a subject image formed by a photographing lens to be photoelectrically converted in the photodiode 23 to generate a signal for image generation. The imaging surface phase difference pixel 2B is configured to divide a pupil region of a photographing lens, and to allow a subject image from the divided pupil region to be photoelectrically converted to generate a signal for phase difference detection. The imaging surface phase difference pixels 2B may be disposed discretely among the imaging pixels 2A as illustrated in FIG. 2. It is to be noted that it is not necessary for the imaging surface phase difference pixels 2B to be disposed independently from one another as illustrated in FIG. 2. The imaging surface phase difference pixels 2B may be disposed, for example, in lines P1 to P7 in a pixel section 200 as illustrated in FIG. 3A. Moreover, in imaging surface phase difference detection, a signal obtained from a pair of (two) imaging surface phase difference pixels 2B may be used. For example, it is desirable that, as illustrated in FIG. 3B, two imaging surface phase difference pixels 2B be adjacently disposed, and the light shielding film 13A be embedded between these imaging surface phase difference pixels 2B. This makes it possible to restrain degradation of phase difference detection accuracy due to reflected light. It is to be noted that the configuration illustrated in FIG. 3B corresponds to a concrete example of a case in which the "first pixel" and the "second pixel" are both imaging surface phase difference pixels.

As mentioned above, the two-dimensionally arrayed pixels 2 may constitute a pixel section 100 (refer to FIG. 5) on the Si substrate 21. The pixel section 100 may include an effective pixel region 100A and an optical black (OPB)

region 100B. The effective pixel region 100A may be configured of the imaging pixel 2A and the imaging surface phase difference pixel 2B. The OPB region 100B may be provided so as to surround the effective pixel region 100A. The OPB region 100B is configured to output optical black that may serve as a reference of a black level, and may be provided with only the light receiving section 20 including the photodiode 23, etc., with no light condensing members such as an on-chip lens 11, a color filter, etc. Moreover, a light shielding film 13C (a third light shielding film) may be provided on the light receiving section 20 of the OPB region 100B. The light shielding film 13C is configured to define the black level.

In the present embodiment, as described above, the trench 20A is provided, between the pixels 2, on a light entering side of the light receiving section 20, i.e., in a light receiving surface 20S. The trench 20A allows part of the light receiving section 20 of each pixel 2 to be divided physically. In the trench 20A, the light shielding film 13A is embedded. The light shielding film 13A is continuous with the light shielding film 13B for pupil division of the imaging surface phase difference pixel 2B. Moreover, the light shielding films 13A and 13B are also continuous with the light shielding film 13C provided in the above-mentioned OPB region 100B. These light shielding films 13A, 13B, and 13C constitute a pattern as illustrated in FIG. 2 in the pixel section 100.

In the following, description is given on each member that constitutes each pixel 2.

(Light Condensing Section 10)

The light condensing section 10 may be provided on the light receiving surface 20S of the light receiving section 20, and may include the on-chip lens 11 as an optical function layer on the light entering side. The on-chip lens 11 may be disposed so as to face the light receiving section 20 of each pixel 2. A color filter 12 may be provided between the on-chip lens 11 and the light receiving section 20.

The on-chip lens 11 may have a function of allowing light to be condensed toward the light receiving section 20 (specifically, the photodiode 23 of the light receiving section 20). A lens diameter of the on-chip lens 11 may be set to a value according to a size of the pixel 2, for example, 0.9 μm to 3 μm both inclusive. Moreover, a refractive index of the on-chip lens 11 may be, for example, 1.1 to 1.4 both inclusive. Examples of a lens material may include a silicon oxide film ($SiO_2$), etc. In the present embodiment, the on-chip lenses 11 provided in the imaging pixel 2A and in the imaging surface phase difference pixel 2B may be identically shaped. Here, the term "identically" refers to being manufactured with use of a same material and in a same process, but shall not exclude variations due to various conditions in manufacture.

The color filter 12 may be, for example, any one of a red (R) filter, a green (G) filter, a blue (B) filter, and a white (W) filter, and may be provided, for example, for each pixel 2. These color filters 12 may be provided in a regular color array (for example, a Bayer array). Providing the color filters 12 in such a way allows the image sensor 1 to obtain color light reception data corresponding to the color array. It is to be noted that there is no particular limitation on a color scheme of the color filters 12 in the imaging surface phase difference pixel 2B, but preferably the green (G) filter or the white (W) filter may be used so as to make it possible to use an automatic focusing (AF) function even in a dark place with a small light quantity. Also, the use of the white (W) filter makes it possible to obtain information on phase difference detection with higher accuracy. However, when the green (G) filter or the white (W) filter is assigned to the imaging surface phase difference pixel 2B, the photodiode 23 of the imaging surface phase difference pixel 2B is likely to be saturated in a bright place with a large light quantity. In this case, an overflow barrier of the light receiving section 20 may be closed.

(Light Receiving Section 20)

The light receiving section 20 may be configured of the silicon (Si) substrate 21 in which the photodiode 23 is embedded, a wiring layer 22, and a fixed charge film 24. The wiring layer 22 may be provided on a front surface of the Si substrate 21 (on an opposite side to the light receiving surface 20S). The fixed charge film 24 may be provided on a rear surface (the light receiving surface 20S) of the Si substrate 21. Moreover, as mentioned above, the trench 20A is provided between the pixels 2 on the light receiving surface 20S side of the light receiving section 20. A width (W) of the trench 20A may be a width large enough to restrain crosstalk, for example, 20 nm to 5000 nm both inclusive. A depth (a height (h)) may be a depth large enough to restrain crosstalk, for example, 0.3 μm to 10 μm both inclusive. It is to be noted that the wiring layer 22 may be provided with transistors such as a transfer transistor, a reset transistor, an amplifier transistor, etc. and various wirings.

The photodiode 23 may be, for example, an n-type semiconductor region formed in a depthwise direction of the Si substrate 21, and may constitute a p-n junction photodiode with a p-type semiconductor region provided in vicinity of the front surface and the rear surface of the Si substrate 21. In the present embodiment, the n-type semiconductor region in which the photodiode 23 is formed is referred to as a photoelectric converting region R. It is to be noted that the p-type semiconductor region confronted by the front surface and the rear surface of the Si substrate 21 may also serve as a hole charge accumulating region so as to restrain a dark current and to transfer generated charges (electrons) in a direction toward the front surface. This allows for reduction in noise, and further leads to smooth transfer because charges are accumulated in a region close to the front surface. Moreover, the Si substrate 21 may be provided with the p-type semiconductor region between the pixels 2.

The fixed charge film 24 is configured to fix charges at an interface between the light condensing section 10 and the light receiving section 20. The fixed charge film 24 may be provided between the light condensing section 10 (specifically, the color filter 12) and the light receiving surface 20S of the Si substrate 21, and may extend continuously from a sidewall to a bottom surface of the trench 20A provided between the pixels 2. This makes it possible to restrain depinning caused by physical damage in forming the trench 20A or activation of impurities in ion irradiation. As a material of the fixed charge film 24, a high dielectric material including many fixed charges may be preferably used. Specific examples may include hafnium oxide ($HfO_2$), aluminum oxide ($Al_2O_3$), tantalum oxide ($Ta_2O_5$), zirconium oxide ($ZrO_2$), titanium oxide ($TiO_2$), magnesium oxide ($MgO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), etc. Alternatively, hafnium nitride, aluminum nitride, hafnium oxynitride, or aluminum oxynitride may be also used. A thickness of the fixed charge film 24 may be, for example, 1 nm to 200 nm both inclusive. In another alternative, instead of the fixed charge film 24, silicon oxide ($SiO_2$) including no fixed charges may be also used. In this case, for example, as illustrated in FIG. 5A, the light shielding film 13 (13A, 13B, and 13C) having conductivity may be formed on a $SiO_2$ film 27, and a negative potential may be constantly applied to the light shielding film 13 during an imaging operation so as to generate pinning.

Figure 4A:
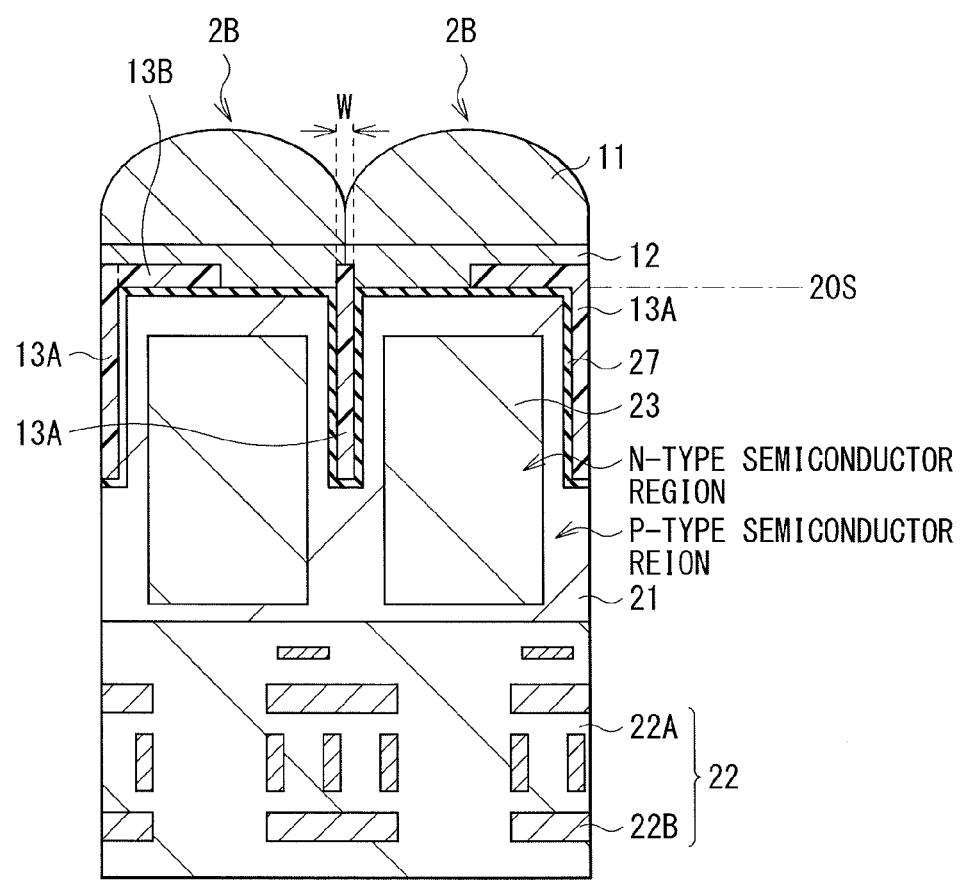
FIG. 4A is a cross-sectional view illustrating a configuration of a main part in a case without a fixed charge film.
Figure 4B:
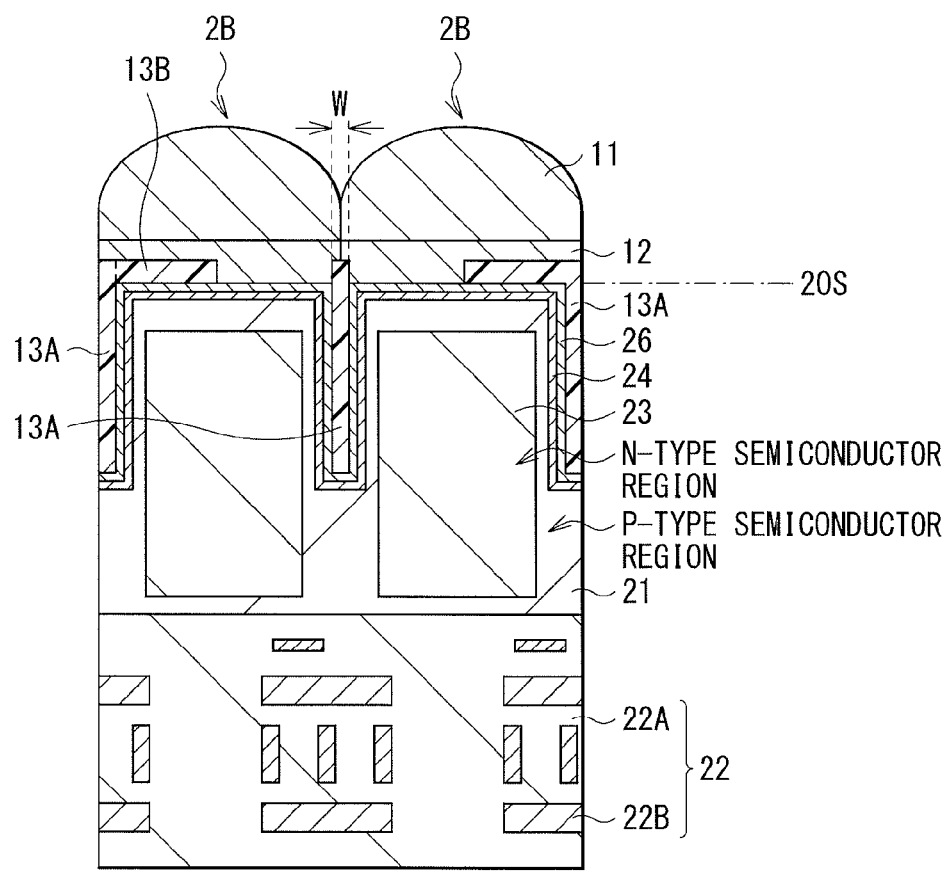
FIG. 4B is a cross-sectional view illustrating a configuration of a main part in a case with another layer between the fixed charge film and a light shielding film.
Figure 4C:
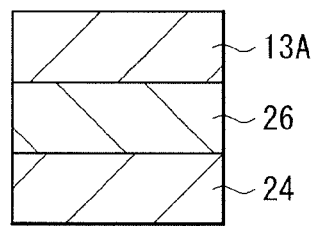
FIG. 4C is an enlarged view of a stacked structure illustrated in FIG. 4B.

Furthermore, in an example in FIG. 1, the light shielding film 13A (13B or 13C, the same applies hereinafter) is formed on the fixed charge film 24 to constitute a two-layer structure of the fixed charge film 24 and the light shielding film 13A. However, another layer 26 may be further interposed between the fixed charge film 24 and the light shielding film 13A. For example, as illustrated in FIGS. 4B and 4C, a single-layer film or a stacked film may be interposed as the layer 26 between the fixed charge film 24 and the light shielding film 13A. The single-layer film or the stacked film may include at least one of an insulating film, a barrier metal layer, etc. It is to be noted that FIG. 4C illustrates, in an enlarged manner, a stacked structure of the fixed layer film 24, the layer 26, and the light shielding film 13A in FIG. 4B. Examples of the insulating film used for the layer 26 may include a $SiO_2$ film deposited by, for example, a CVD (Chemical Vapor Deposition) method. This allows for reinforcement of insulation. Also, providing the barrier metal layer makes it possible to restrain metal diffusion in semiconductor layers. When the layer 26 is a stacked film, for example, a possible stacking order may be as follows: the light shielding film 13A/the barrier metal layer/the insulating film/the fixed charge film 24. This makes it possible to obtain both effects of reinforcing insulation and restraining metal diffusion.

In the present embodiment, as described above, the light shielding film 13 is provided between the above-mentioned light condensing section 10 and the light receiving section 20.

The light shielding film 13 may be configured of the light shielding film 13A, the light shielding film 13B, and the light shielding film 13C. The light shielding film 13A is embedded in the trench 20A provided between the pixels 2. The light shielding film 13B is provided so as to serve as a light shielding film for pupil division of the imaging surface phase difference pixel 2B. The light shielding film 13C may be formed on an entire surface of the OPB region. The light shielding film 13A is configured to restrain color mixture caused by crosstalk of obliquely entering light between adjacent pixels, and may be provided in, for example, a lattice shape so as to surround each pixel 2 in the effective pixel region 200A, as illustrated in FIG. 2. In other words, the light shielding film 13 may have a structure in which apertures 13a are provided on optical paths of the respective on-chip lenses 11. It is to be noted that the apertures 13a in the imaging surface phase difference pixels 2B each may be provided at a position shifted to one side (decentered) by means of the light receiving film 13B for pupil division provided in part of the light receiving region R. In the present embodiment, the light shielding film 13 (13A, 13B, and 13C) may be formed in a same process, and formed continuously with one another. The light shielding film 13 may be configured of, for example, tungsten (W), aluminum (Al), or an alloy of Al and copper (Cu), and its thickness may be, for example, 20 nm to 5000 nm both inclusive. It is to be noted that it is not necessary for the light shielding film 13B and the light shielding film 13C formed on the light receiving surface 20S to have a same thickness. The light shielding film 13B and the light shielding film 13C may be designed with their respective arbitrary thicknesses.

Figure 5:
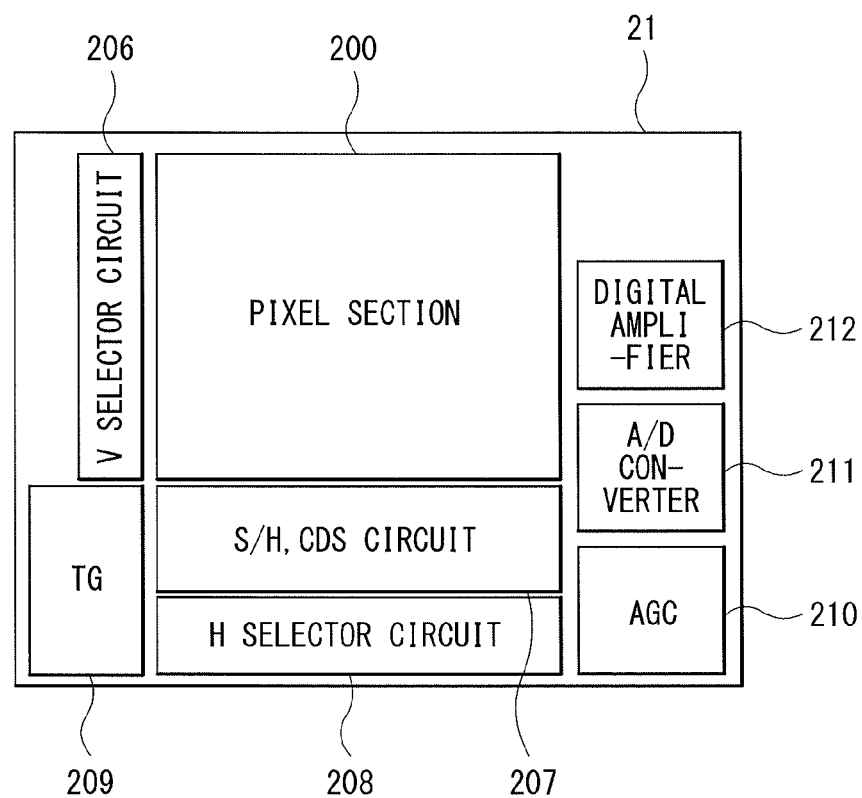
FIG. 5 is a block diagram illustrating a peripheral circuit configuration of a light receiving section illustrated in FIG. 1.

FIG. 5 is a functional block diagram illustrating a peripheral circuit configuration of the pixel region 100 of the light receiving section 20. The light receiving section 20 may include a vertical (V) selector circuit 206, a S/H (sample/hold)·CDS (Correlated Double Sampling) circuit 207, a horizontal (H) selector circuit 208, a timing generator (TG) 209, an AGC (Automatic Gain Control) circuit 210, an A/D converter circuit 211, and a digital amplifier 212, which are mounted on the same Si substrate (chip) 21.

The image sensor 1A may be manufactured, for example, as follows.

(Manufacturing Method)

First, the p-type semiconductor region and the n-type semiconductor region may be formed in the Si substrate 21 to form the photodiode 23 corresponding to each pixel 2. Subsequently, on the opposite surface (the front surface) to the light receiving surface 20S of the Si substrate 21, the wiring layer 22 having a multi-layered wiring structure may be formed. Next, the trench 20A may be formed by, for example, dry etching at a predetermined position of the light receiving surface 20S (the rear surface) of the Si substrate 21, specifically, in the p-type semiconductor region provided between the pixels 2. Subsequently, on the light receiving surface 20S of the Si substrate 21 and from a wall surface to the bottom surface of the trench 20A, by a sputtering method, a CVD method, or an ALD (Atomic Layer Deposition) method, a $HfO_2$ film may be deposited to a thickness of, for example, 50 nm to form the fixed charge film 24. Depositing the $HfO_2$ film by an ALD method may be preferable, because a $SiO_2$ film to reduce an interface level may be simultaneously deposited to a thickness of, for example, 1 nm.

Subsequently, as the light shielding film 13, for example, a W film may be formed by using, for example, a sputtering method or a CVD method on part of the light receiving region R of the imaging surface phase difference pixel 2B and on the OPB region 100B, while allowing the W film to be embedded in the trench 20A. Next, patterning by photolithography, etc. may be carried out to form the light receiving film 13. Subsequently, on the light receiving section 20 and the light shielding film 13 in the effective pixel region 100A, the color filter 12 in, for example, the Bayer array and the on-chip lens 11 may be formed sequentially. Thus, the image sensor 1A may be obtained.

(Workings and Effects)

In the backside illuminated image sensor 1A as in the present embodiment, in order to restrain occurrence of color mixture between adjacent pixels, it is desirable to reduce a thickness (to lower a profile) from an exiting surface of the on-chip lens 11 on the light entering side (the light condensing section 10) to the light receiving section 20. Moreover, in the imaging pixel 2A, setting a condensing point of entering light at the photodiode 23 allows for highest pixel characteristics, while in the imaging surface phase difference pixel 2B, setting the condensing point of entering light at the light shielding film 13B for pupil division allows for highest AF characteristics.

Thus, in order to allow entering light in the imaging pixel 2A and the imaging surface phase difference pixel 2B to be condensed at respective appropriate positions, the above-described improvements have been made in which curvatures of the on-chip lenses 11 are changed, or the Si substrate 21 is provided with a level difference so as to allow a level of the light receiving surface 20S in the imaging surface phase difference pixel 2B to be lower than that in the imaging pixel 2A. However, it is difficult to form components such as the on-chip lens 11, the light receiving surface 20S, i.e., the Si substrate 21, etc. separately for each pixel. In recent years, higher sensitivity and downsizing are expected in an imaging device, and further advance in pixel micronization may make separate formation of components more difficult.

Moreover, when the light receiving surfaces 20S in the imaging pixel 2A and the imaging surface phase difference pixel 2B are formed in different levels, there may occur crosstalk due to obliquely entering light between the pixels 2. Specifically, light passing through the on-chip lens 11 of the imaging pixel 2A may enter the light receiving surface 20S formed lower by one stage in the imaging surface phase difference pixel 2B, causing occurrence of color mixture in the light condensing section. Alternatively, light passing through the imaging surface phase difference pixel 2B may pass through a wall surface of a level difference provided between the pixels to enter the photodiode 23 in the imaging pixel 2A, causing occurrence of color mixture in a bulk (the photodiode 23). Furthermore, light entering (obliquely entering) through adjacent pixels may cause possibility of degradation in phase difference detection accuracy.

On the other hand, in the image sensor 1A according to the present embodiment, the trench 20A is provided between the pixels 2 in the Si substrate 21. The light shielding film 13A is embedded in the trench 20A. Furthermore, the light shielding film 13A is continuous with the light shielding film 13B for pupil division provided in the imaging surface phase difference pixel 2B. Thus, obliquely entering light through adjacent pixels is shielded by the light shielding film 13A embedded in the trench 20A, while entering light in the imaging surface phase difference pixel 2B is allowed to be condensed at a position of the light shielding film 13B for pupil division.

As described above, in the present embodiment, the trench 20A is provided between the pixels 2 in the light receiving section 20. The light shielding film 13A is embedded in the trench 20A. The light shielding film 13A is continuous with the light shielding film 13B for pupil division provided in the imaging surface phase difference pixel 2B. Thus, obliquely entering light through adjacent pixels is shielded by the light shielding film 13A embedded in the trench 20A, while the condensing point of entering light in the imaging surface phase difference pixel 2B is allowed to be at a position of the light shielding film 13B for pupil division. Hence, it is possible to generate a signal for phase difference detection with high accuracy in the imaging surface phase difference pixel 2B, leading to enhancement in AF characteristics of the imaging surface phase difference pixel 2B. Also, color mixture due to crosstalk of obliquely entering light through adjacent pixels is restrained, making it possible to enhance pixel characteristics of the imaging pixel 2A as well as the imaging surface phase difference pixel 2B. In other words, it is possible to provide an imaging device that makes it possible to maintain characteristics of both the imaging pixel 2A and the imaging surface phase difference pixel 2B with a simple configuration.

Moreover, the p-type semiconductor region is provided on the light receiving surface 20S of the Si substrate 21, making it possible to restrain occurrence of a dark current. Furthermore, the fixed charge film 24 is provided on the light receiving surface 20S and extends continuously from the wall surface to the bottom surface of the trench 20A. This makes it possible to further restrain occurrence of a dark current. In other words, it is possible to reduce noise in the image sensor 1A, and to obtain signals with high accuracy from the imaging pixel 2A and the imaging surface phase difference pixel 2B.

In addition, the light shielding film 13C provided in the OPB region 100B is formed in the same process as those of the light shielding film 13A and the light shielding film 13B. Hence, it is possible to simplify a manufacturing process.

In the following, description is given on a second embodiment and modification examples 1 to 3. Similar components to those in the above-described first embodiment are denoted by similar reference numerals, and description thereof is omitted appropriately.

2. Modification Example 1

Figure 6:
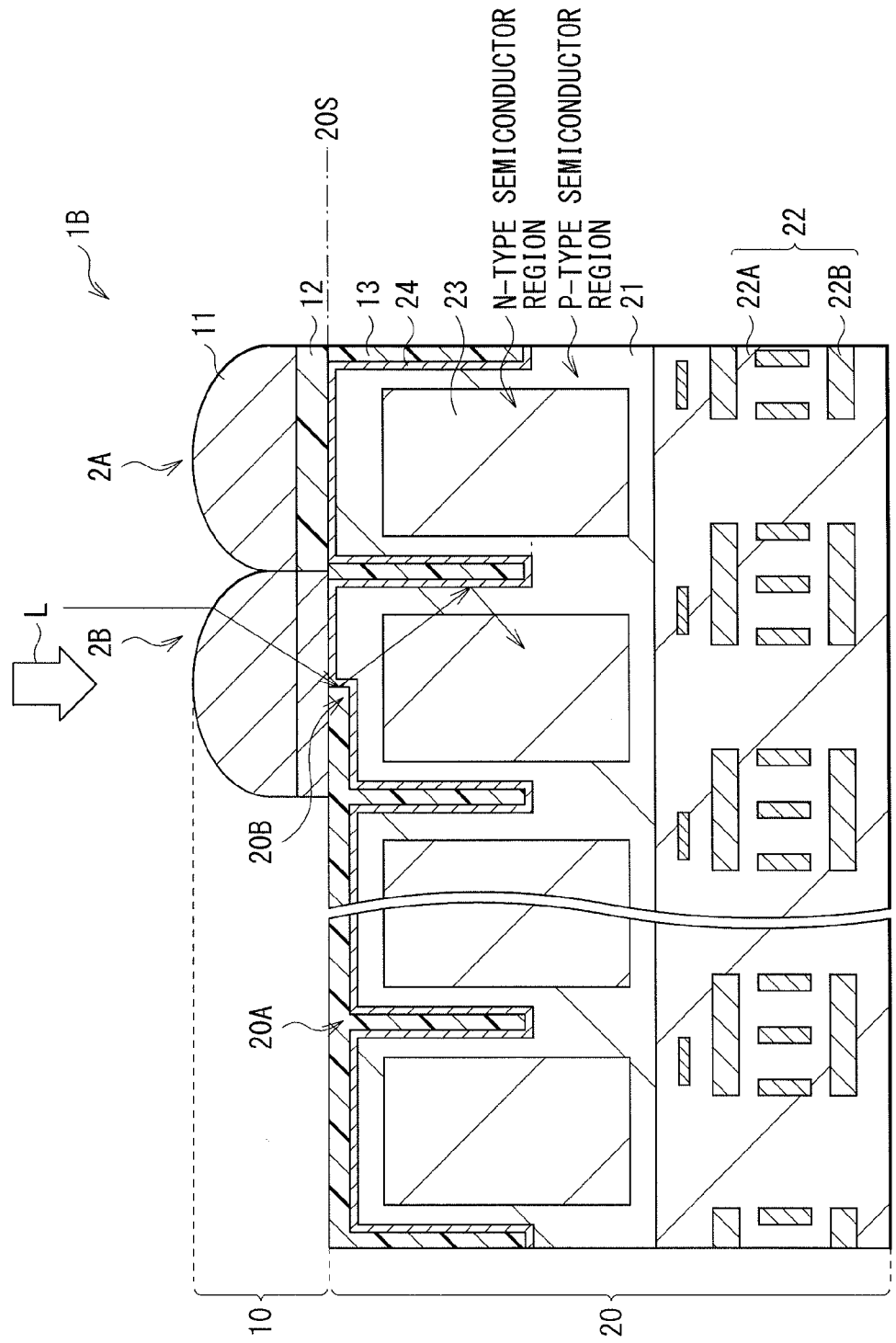
FIG. 6 is a cross-sectional view of an image sensor according to a modification example 1.

FIG. 6 illustrates a cross-sectional configuration of an image sensor (an image sensor 1B) according to a modification example 1. The image sensor 1B may be a backside illuminated solid state imaging element, similarly to the image sensor 1A in the above-described first embodiment, and may have a structure in which the plurality of pixels 2 are two-dimensionally arrayed. The pixels 2 may be configured of the imaging pixel 2A and the imaging surface phase difference pixel 2B. The trench 20A is provided between the pixels 2, similarly to the first embodiment. The light shielding film 13A is embedded in the trench 20A. The light shielding film 13A is continuous with the light shielding film 13B for pupil division provided in the imaging surface phase difference pixel 2B. However, the image sensor 1B in the present modification example is different from the first embodiment in that the light shielding film 13B is embedded in the Si substrate 21.

The light shielding film 13B in the present modification example may be embedded in the light receiving section 20, specifically on the light receiving surface 20S side of the Si substrate 21 in which the photodiode 23 is embedded. Moreover, the fixed charge film 24 may be provided between the Si layer 21 and the light shielding films 13A and 13B. Specifically, the fixed charge film 24 may be provided continuously from the light receiving surface 20S of the Si substrate 21, through a level difference 20B formed by the light shielding film 14B, to the wall surface and the bottom surface of the trench 20A.

Furthermore, in the present modification example, the light shielding film 13C may be also embedded in the Si substrate 21, similarly to the light shielding film 13B. The light shielding film 13C may be provided in the OPB region 100B surrounding the effective pixel region 100A in which the imaging pixel 2A and the imaging surface phase difference pixel 2B are disposed in a two-dimensional array.

The image sensor 1B may be manufactured, for example, for example, as follows. First, in a similar manner to the first embodiment, the p-type semiconductor region and the n-type semiconductor region may be formed in the Si substrate 21 to form the photodiode 23. Thereafter, the wiring layer 22 may be formed on the front surface of the Si substrate 21. Subsequently, after bonding the Si substrate 21 to an undepicted support substrate, the rear surface side of the Si substrate 21 may be thinned to a desired thickness. Thereafter, the trench 20A (for the light shielding film 13A) as an element separation section may be formed by etching in the light receiving surface 20S (the rear surface) of the Si substrate 21. Subsequently, patterning may be carried out, and part of the front surface of the Si substrate 21 may be etched off to form the level difference 20B for embedding the light shielding film 13B. Subsequently, on the light receiving surface 20S of the Si substrate 21, the level difference 20B, and from the wall surface to the bottom surface of the trench 20A, by, for example, a sputtering method, a HfO$_2$ film may be deposited to a thickness of, for example, 50 nm to form the fixed charge film 24.

Subsequently, as the light shielding film 13, for example, a W film may be formed by using, for example, a sputtering method on part of the light receiving region R of the imaging surface phase difference pixel 2B and on the OPB region 100B, while allowing the W film to be embedded in the trench 20A. Thereafter, patterning by photolithography, etc. may be carried out to form the light receiving film 13. Next, on the light receiving section 20 and the light shielding film 13 in the effective pixel region 100A, the color filter 12 in, for example, the Bayer array and the on-chip lens 11 may be formed sequentially. Thus, the image sensor 1B may be obtained.

As described above, in the present modification example, the light shielding film 13B is embedded in the light receiving section 20. This allows for improvement in the condensing position of entering light in the imaging surface phase difference pixel 2B, making it possible to generate signals for phase difference detection with higher accuracy. Also, it is possible to lower a profile of the OPB region 100B, which is advantageous for lowering a profile of the whole imaging element.

3. Second Embodiment

Figure 7:
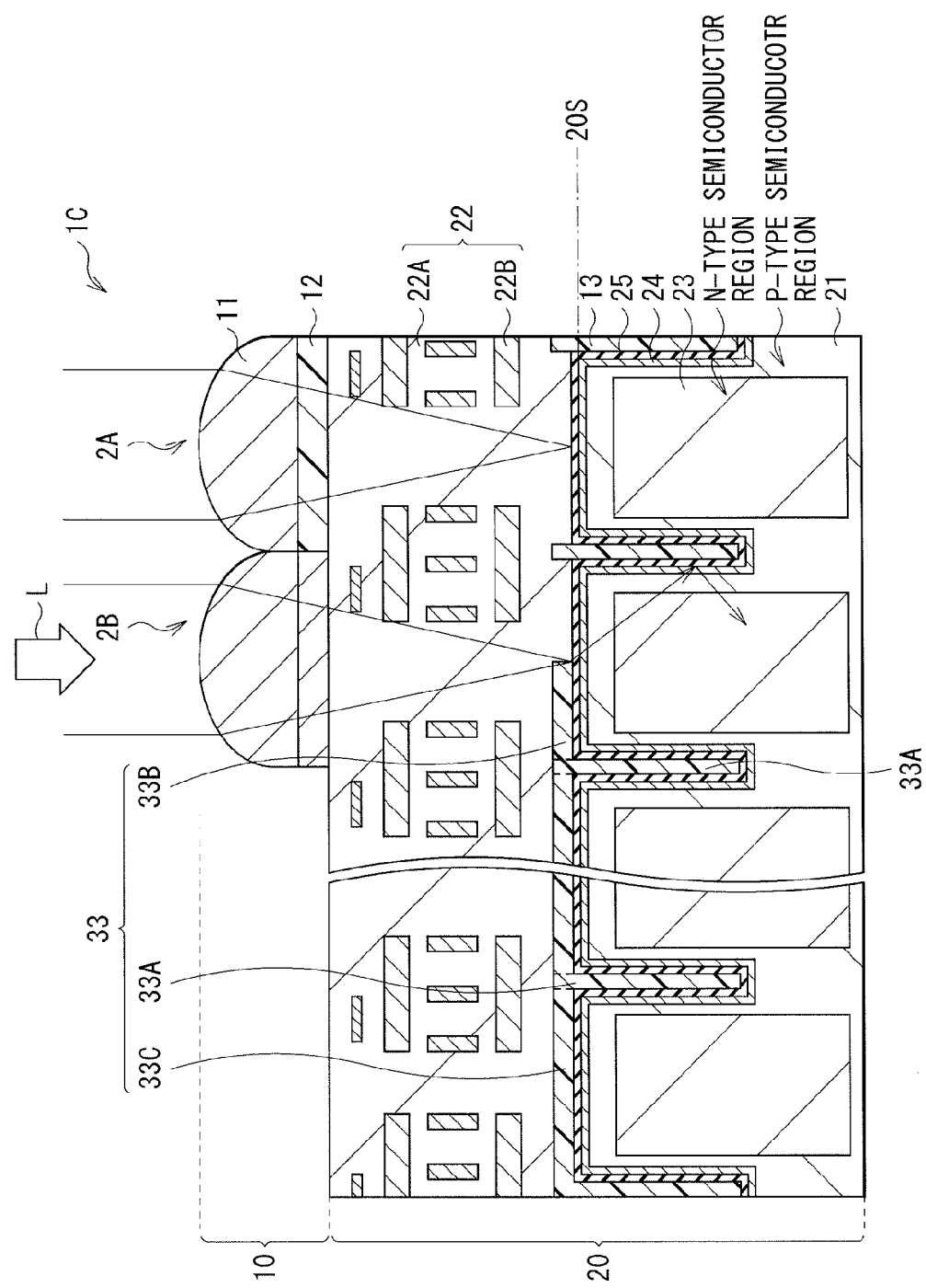
FIG. 7 is a cross-sectional view of an image sensor according to a second embodiment of the present disclosure.

FIG. 7 illustrates a cross-sectional configuration of an image sensor (an image sensor 1C) according to a second embodiment of the present disclosure. The image sensor 1C may be, for example, a surface illuminated (surface light receiving) solid state imaging element, and may include the plurality of pixels 2 two-dimensionally arrayed. The pixels 2 may be configured of the imaging pixel 2A and the imaging surface phase difference pixel 2B. The trench 20A is provided between the pixels 2, similarly to the above-described first embodiment and the modification example 1. A light shielding film (the light shielding film 13A) is embedded in the trench 20A. The light shielding film (the light shielding film 13A) is continuous with a light shielding film (the light shielding film 13B) for pupil division in the imaging surface phase difference pixel 2B. However, the image sensor 1C according to the present embodiment is a surface illuminated one, and the wiring layer 22 may be therefore provided between the light condensing section 10 and the Si substrate 21 that constitutes the light receiving section 20. A light shielding film 33 (33A, 33B, and 33C) may be provided between the Si substrate 21 of the light receiving section 20 and the wiring layer 22. It is to be noted that the light receiving surface 20S in the surface illuminated image sensor 1C (1D and 1E which are described later) as in the present embodiment may correspond to an illuminated surface of the Si substrate 21.

Figure 8:
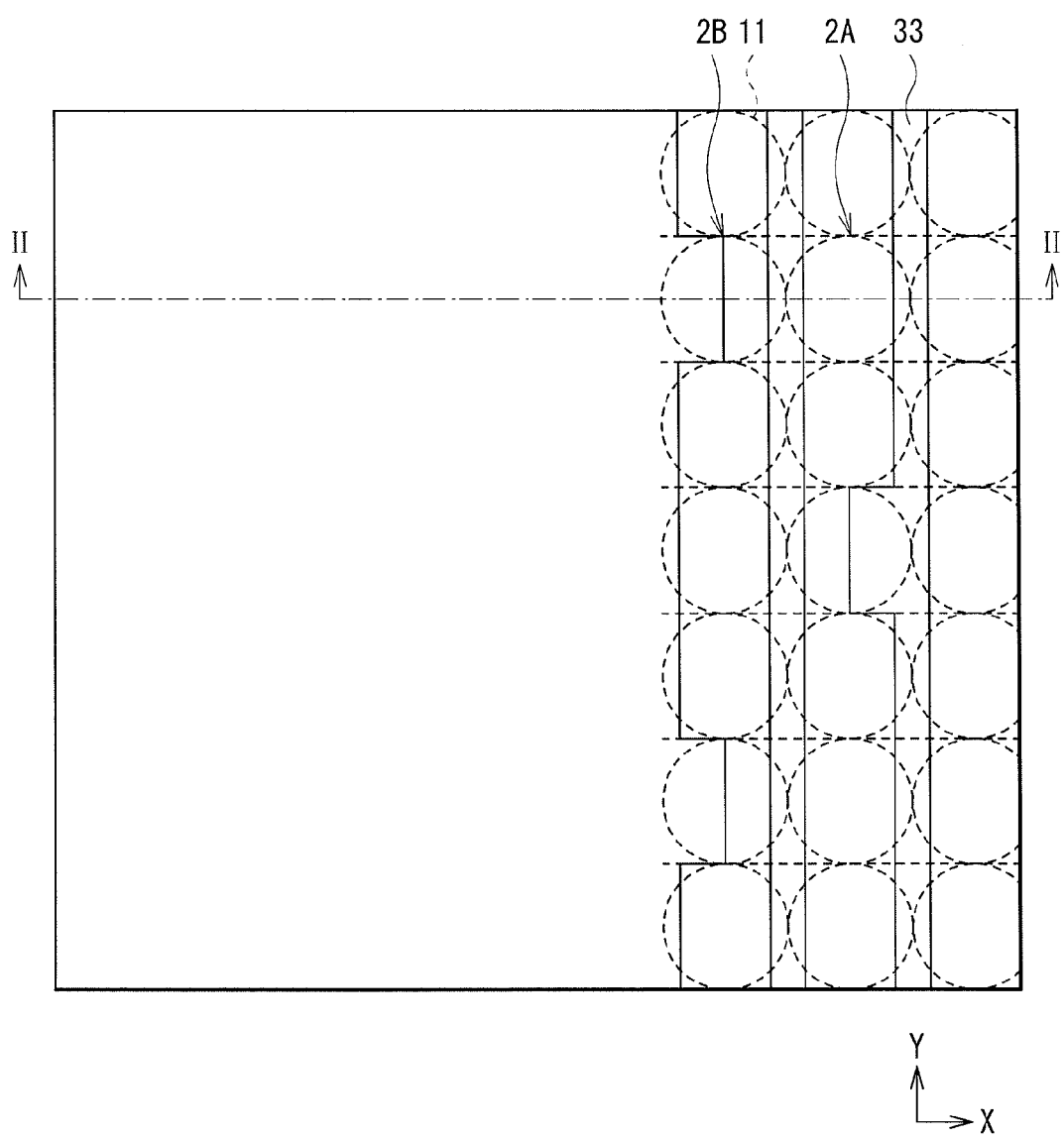
FIG. 8 is an exemplary plan view of the image sensor illustrated in FIG. 7.

In the present embodiment, the wiring layer 22 may be provided between the light condensing section 10 and the Si substrate 21. In the first embodiment, as described above, the wiring layer 22 is provided on the opposite surface to the surface on which the light condensing section 10 is provided of the Si substrate 21. Accordingly, the trench 20A may be formed in a lattice shape so as to surround each pixel 2 separately, similarly to the above-described first embodiment. Alternatively, the trench 20A may be provided, for example, as illustrated in FIG. 8, along only one of an X axis and a Y axis (here, along the Y axis). This allows for smooth charge movement from the photodiode 23 to the transistors (for example, the transfer transistor) provided between the pixels 2 in the Si substrate 21.

The image sensor 1C may be configured of the light condensing section 10 and the light receiving section 20. The light condensing section 10 may be configured of the on-chip lens 11 and the color filter 12. The light receiving section 20 may include the Si substrate 21 in which the photodiode 23 is embedded, the wiring layer 22, and the fixed charge film 24. In the present embodiment, an insulating film 25 may be formed so as to cover the fixed charge film 24, and the light shielding films 33A, 33B, and 33C may be formed on the insulating film 25. Examples of a material of the insulating film 25 may include a silicon oxide film (SiO), a silicon nitride film (SiN), a silicon oxynitride film (SiON), etc., and its thickness may be, for example, 1 nm to 200 nm both inclusive.

The wiring layer 22 may be provided between the light condensing section 10 and the Si substrate 21, and may have a multi-layered wiring structure configured of, for example, two layers of, or three or more layers of metal films 22B with an interlayer insulating film 22A in between. The metal film 22B may be a metal film of the transistors, the various wirings, or the peripheral circuits. In general surface illuminated image sensors, such metal film may be provided between the pixels so as to ensure an aperture ratio of pixels and so as not to shield a light beam exiting through an optical function layer such as the on-chip lens, etc.

As the interlayer insulating film 22A, for example, an inorganic material may be used. Specific examples may include a silicon oxide film (SiO), a silicon nitride film (SiN), a silicon oxynitride film (SiON), a hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and zirconium oxynitride film, etc. A thickness of the interlayer insulating film 22A may be, for example, 0.1 μm to 5 μm both inclusive.

The metal film 22B may be, for example, an electrode that constitutes the above-mentioned transistors corresponding to each pixel 2. Examples of its material may include a single substance or an alloy of a metal element such as aluminum (Al), chromium (Cr), gold (Au), platinum (Pt), nickel (Ni), copper (Cu), tungsten (W), or silver (Ag), etc. It is to be noted that, generally, as mentioned above, the metal film 22B may have a suitable size between the pixels 2, so as to ensure the aperture ratio of the pixel 2 and so as not to shield light exiting through the optical function layer such as the on-chip lens 11, etc.

The image sensor 1B may be manufactured, for example, as follows. First, in a similar manner to the first embodiment, the p-type semiconductor region and the n-type semiconductor region may be formed in the Si substrate 21 to form the photodiode 23. Subsequently, the trench 20A may be formed by, for example, dry etching at a predetermined position of the light receiving surface 20S (the front surface) of the Si substrate 21, specifically, in the p-type semiconductor region provided between the pixels 2. Subsequently, from the wall surface to the bottom surface of the trench 20A in the Si substrate 21, by, for example, a sputtering method, a HfO$_2$ film may be deposited to a thickness of, for example, 50 nm to form the fixed charge film 24.

Next, on the light receiving surface 20S, by, for example, a CVD method or an ALD method, the fixed charge film 24 may be formed. Thereafter, by, for example, a CVD method, the insulating film 25 made of, for example, SiO$_2$ may be formed. Subsequently, as the light shielding film 33, for example, a W film may be formed by using, for example, a sputtering method on the insulating film 25, while allowing the W film to be embedded in the trench 20A. Thereafter, patterning by photolithography, etc. may be carried out to form the light receiving film 33.

Next, the wiring layer 22 may be formed on the light shielding film 33 and the light receiving surface 20S. Thereafter, on the light receiving section 20 and the light shielding film 13 in the effective pixel region 100A, the color filter 12 in, for example, the Bayer array and the on-chip lens 11 may be formed sequentially. Thus, the image sensor 1C may be obtained.

It is to be noted that, preferably, the green (G) filter or the white (W) filter may be assigned to the color filter 12 of the imaging surface phase difference pixel 2B in the present embodiment, similarly to the first embodiment; but the photodiode 23 is likely to be saturated with charges when light with a large light quantity enters it. At this occasion, in the surface illuminated type, excessive charges may be discharged from below the Si substrate 21 (on the substrate 21 side). Accordingly, p-type impurities of higher concentration may be doped in a lower portion of the Si substrate 21 at a position corresponding to the imaging surface phase difference pixel 2B, specifically in a lower portion of the photodiode 23, so as to provide a higher overflow barrier.

As described above, the present disclosure may be applied not only to backside illuminated image sensors but also to surface illuminated image sensors. Also in the surface illuminated ones, effects equivalent to those of the above-described first embodiment, etc. may be obtained. Moreover, in the surface illuminated ones, the on-chip lens 11 and the light receiving surface 20S of the Si substrate 21 are spaced apart from each other. Hence, it is possible to set the light condensing point at the light receiving surface 20S easily, making it easier to enhance both imaging pixel sensitivity and phase difference detection accuracy, as compared to a case of the backside illuminated ones.

4. Modification Example 2

Figure 9:
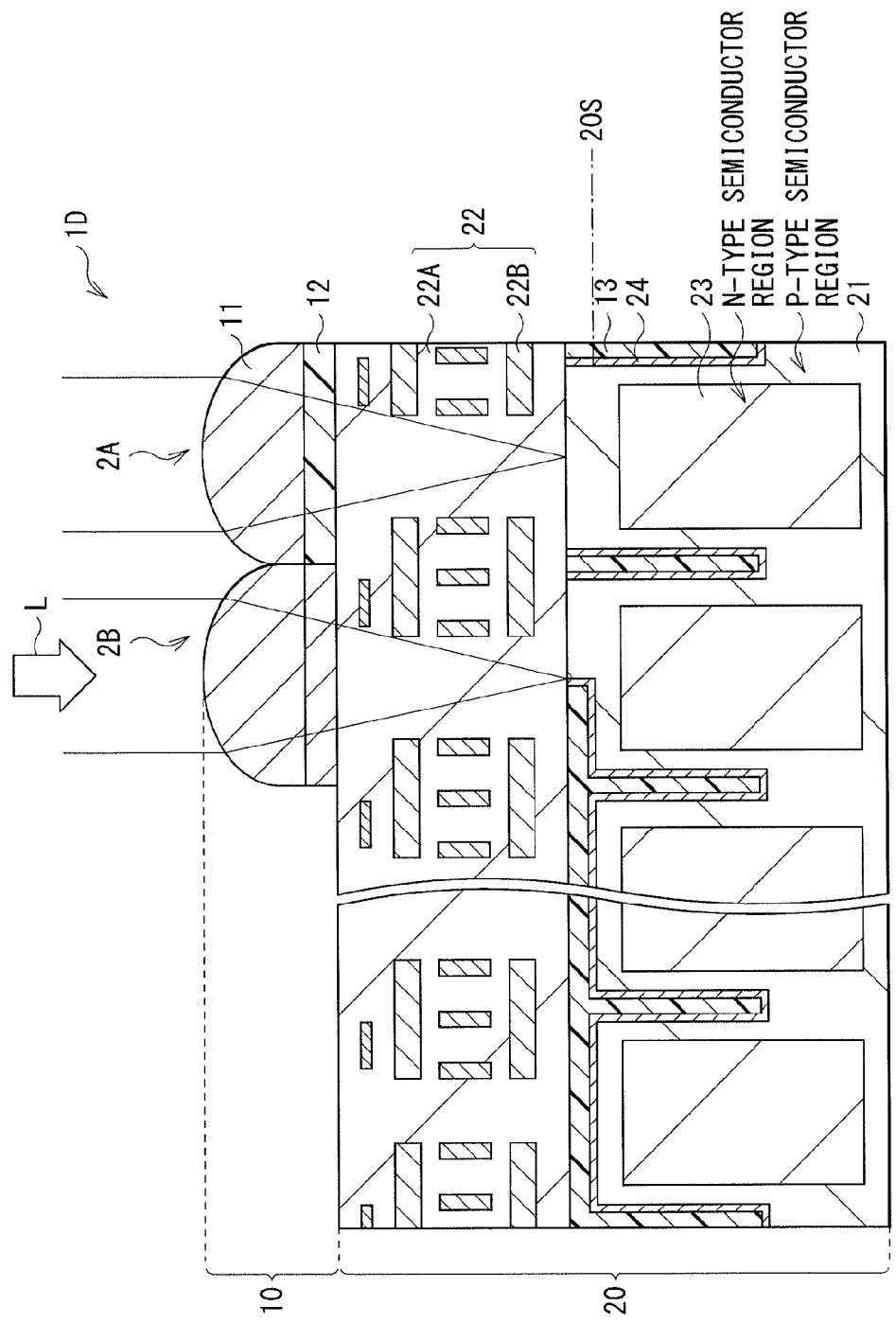
FIG. 9 is a cross-sectional view of an image sensor according to a modification example 2.

FIG. 9 illustrates a cross-sectional configuration of an image sensor (an image sensor 1D) according to a modification example 2 of the above-described second embodiment. The image sensor 1D may be a surface illuminated solid state imaging element, similarly to the above-described image sensor 1C, and may have a structure in which the plurality of pixels 2 are two-dimensionally arrayed. The image sensor 1D in the present modification example is different from the second embodiment in that, similarly to the image sensor 1C of the modification example 1, the light shielding films 13B and 13C are embedded in the Si substrate 21. The light shielding films 13B and 13C are continuous with the light shielding film 13A embedded in the trench 20A provided between the pixels 2.

It is to be noted that, in the present modification example, the fixed charge film 24 may be provided, similarly to the modification example 1, between the light shielding film 13 (13A, 13B, and 13B) embedded in the Si substrate 21 and the Si substrate 21. However, no fixed charge film 24 is provided between the Si substrate 21 and the interlayer insulating film 22, similarly to the second embodiment.

Moreover, the image sensor 1D of the present modification example may be manufactured by a combination of the processes described in the forgoing modification example 1 and the second embodiment.

As described above, in the present modification example, the light shielding film 13B is embedded in the Si substrate 21. This allows for improvement in the light condensing point of entering light in the imaging surface phase difference pixel 2B, making it possible to generate signals for phase difference detection with higher accuracy than that in the above-described image sensor 2C.

5. Modification Example 3

Figure 10:
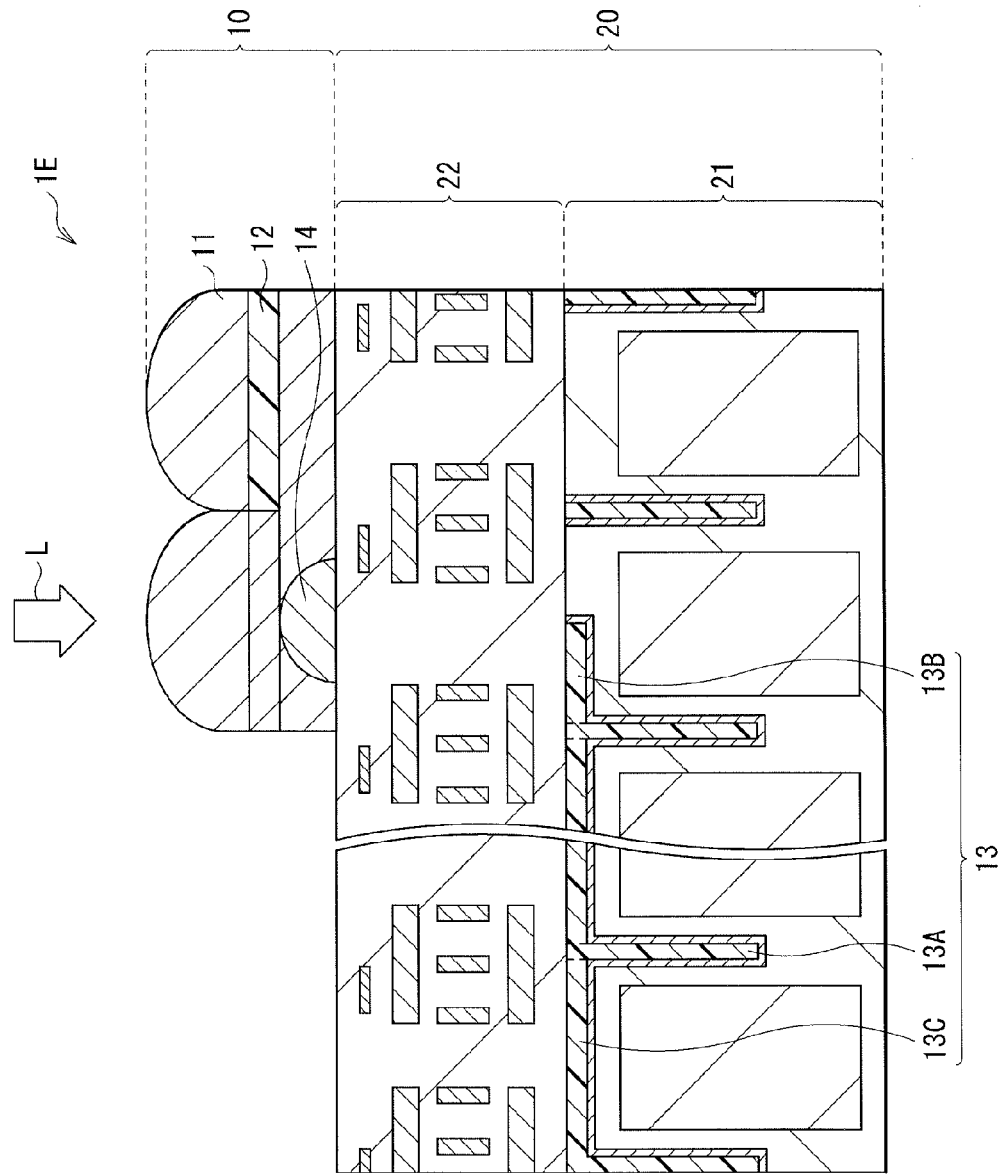
FIG. 10 is a cross-sectional view of an example of an image sensor according to a modification example 3.

FIG. 10 illustrates a cross-sectional configuration of an image sensor (an image sensor 1E) according to the above-described first and second embodiments and the modification examples 1 and 2. The image sensor 1E may be a surface illuminated solid state imaging element, similarly to the image sensors 1C and 1D, and may have a structure in which the plurality of pixels 2 are two-dimensionally arrayed. The image sensor 1E according to the present modification example is different from the above-mentioned embodiments, etc. in that an inner lens 14 is provided between the light receiving section 20 and the color filter 12 of the light condensing section 10 in the imaging surface phase difference pixel 2B.

In the present modification example, the light condensing section 10 may have a multiple lens structure in which the inner lens 14 and the on-chip lens 11 are stacked. This makes it possible to enhance light condensing efficiency in the imaging surface phase difference pixel 2B.

Figure 11:
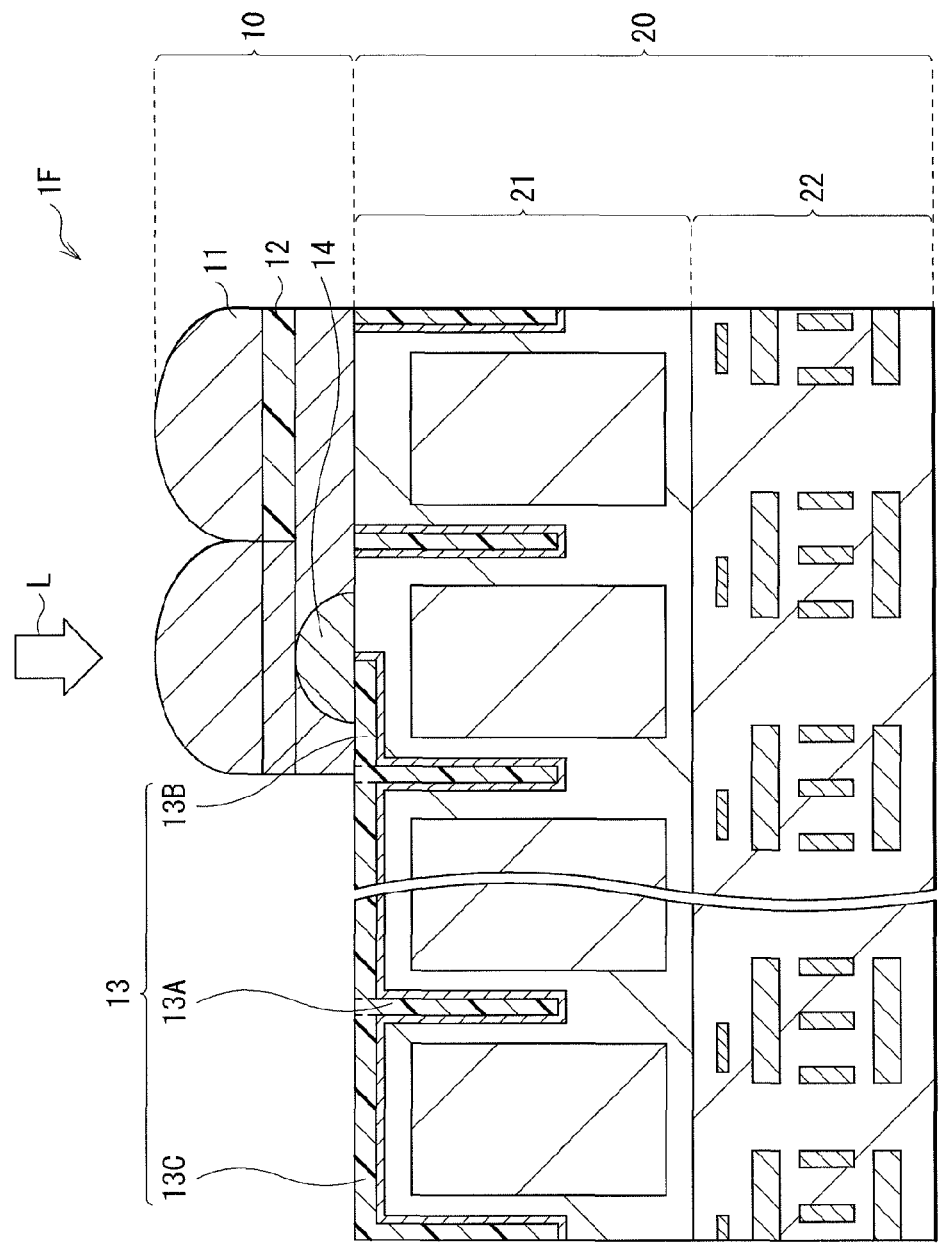
FIG. 11 is a cross-sectional view of another example of the image sensor according to the modification example 3.

It is to be noted that only the imaging surface phase difference pixel 2B is provided with the inner lens 14, here. However, the imaging pixel 2A may be also provided with the inner lens 14. Moreover, application to the backside illuminated solid state imaging element may be also possible, as in an image sensor 1F illustrated in FIG. 11. Furthermore, FIGS. 10 and 11 illustrate a case (corresponding to the modification examples 1 and 2) in which the light shielding film 13B and 13C are embedded in the Si substrate 21. However, the light shielding film 13B and 13C may be provided on the Si substrate 21, as in the image sensors 1A and 1C in the first and second embodiments.

6. Application Examples

In the following, description is given on application examples (application examples 1 to 4) of an image sensor 1 (1A to 1F) described in the forgoing first and second embodiments and modification examples 1 to 3. The image sensor 1 in all the forgoing embodiments, etc. may be applicable to electronic apparatuses in various fields. Here, description is given on, for example, an imaging device (a camera), an endoscope camera, a vision chip (an artificial retina), and a biosensor. Also, though not illustrated, the above-mentioned image sensor 1 may be used as an on-vehicle sensor as well.

Application Example 1

Figure 12:
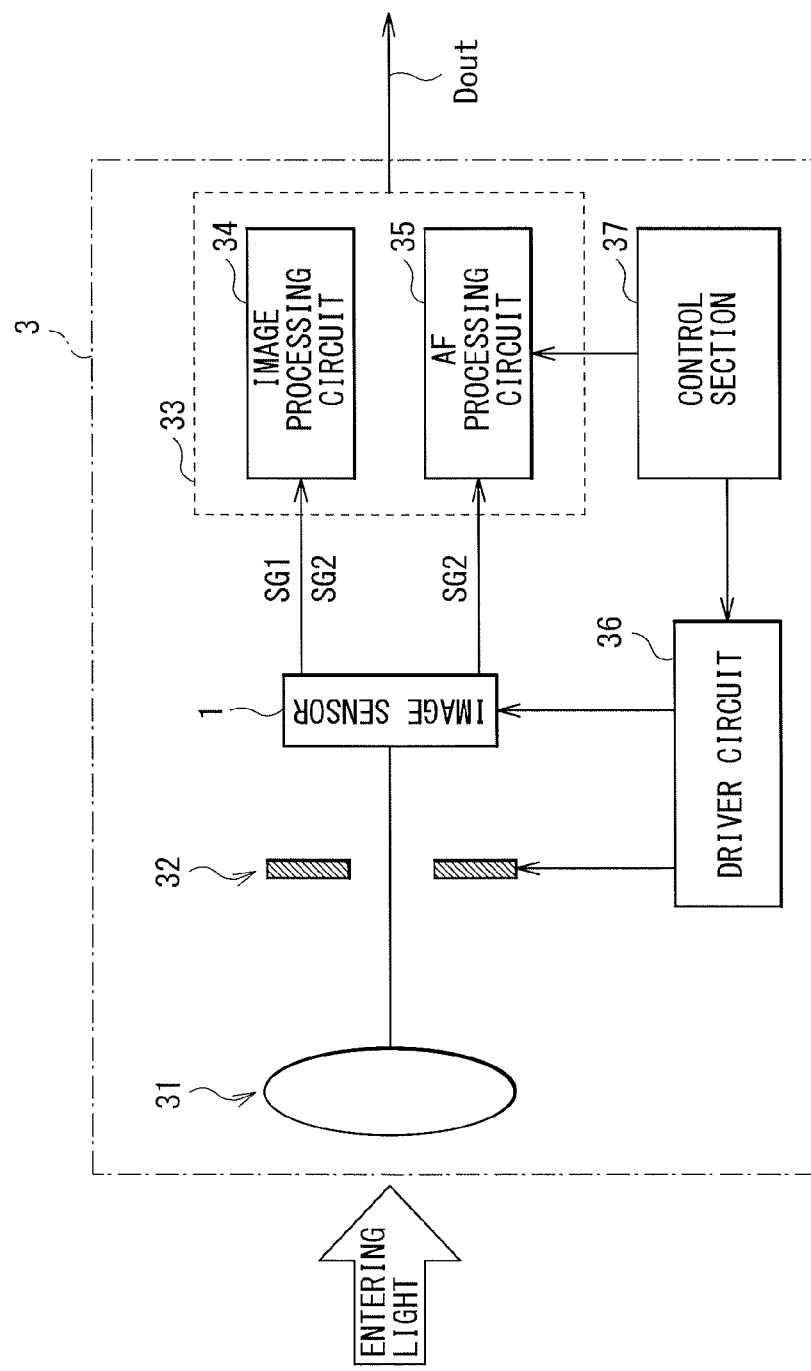
FIG. 12 is a functional block diagram illustrating an overall configuration according to an application example 1 (an imaging device).

FIG. 12 is a functional block diagram illustrating an overall configuration of an imaging device (an imaging device 3). The imaging device 3 may be, for example, a digital still camera or a digital video camera, and may include an optical system 31, a shutter device 32, the image sensor 1 (for example, the image sensor 1A), a signal processing circuit 33 (an image processing circuit 34 and an AF processing circuit 35), a driver circuit 36, and a control section 37.

The optical system 31 may include one or more imaging lenses configured to allow image light (entering light) from an object to be condensed on an imaging surface of the image sensor 1. The shutter device 32 is configured to control a light illumination period (an exposure period) and a light shielding period of the image sensor 1. The driver circuit 36 is configured to perform an opening and closing drive of the shutter device 32 and to drive an exposure operation and a signal read-out operation in the image sensor 1. The signal processing circuit 33 is configured to perform predetermined signal processing on an output signal (SG1 and SG2) from the image sensor 1. The predetermined signal processing may include, for example, various correction processing such as demosaic processing, white balance adjustment processing, etc. The control section 37 may be configured of, for example, a microcomputer, and is configured to control a shutter drive operation and an image sensor drive operation in the drive circuit 36 and to control a signal processing operation in the signal processing circuit 33.

In the imaging device 3, entering light passes through the optical system 21 and the shutter device 22, and is received in the image sensor 1. Then, in the image sensor 1, signal charges based on an amount of received light are accumulated. By the driver circuit 24, the signal charges accumulated in each pixel 2 in the image sensor 1 are read out (an electrical signal SG1 obtained from the imaging pixel 2A and an electrical signal SG2 obtained from the imaging surface phase difference pixel 2B). The electrical signals SG1 and SG2 thus read out are outputted to the image processing circuit 34 and the AF processing circuit 35 in the signal processing circuit 23. The output signal outputted from the image sensor 1 is subjected to the predetermined signal processing in the signal processing section 33. The signal thus processed is outputted to the outside (a monitor, etc.) as a picture signal Dout, or is stored in a storage section (a storage medium) such as an undepicted memory.

Application Example 2

Figure 13:
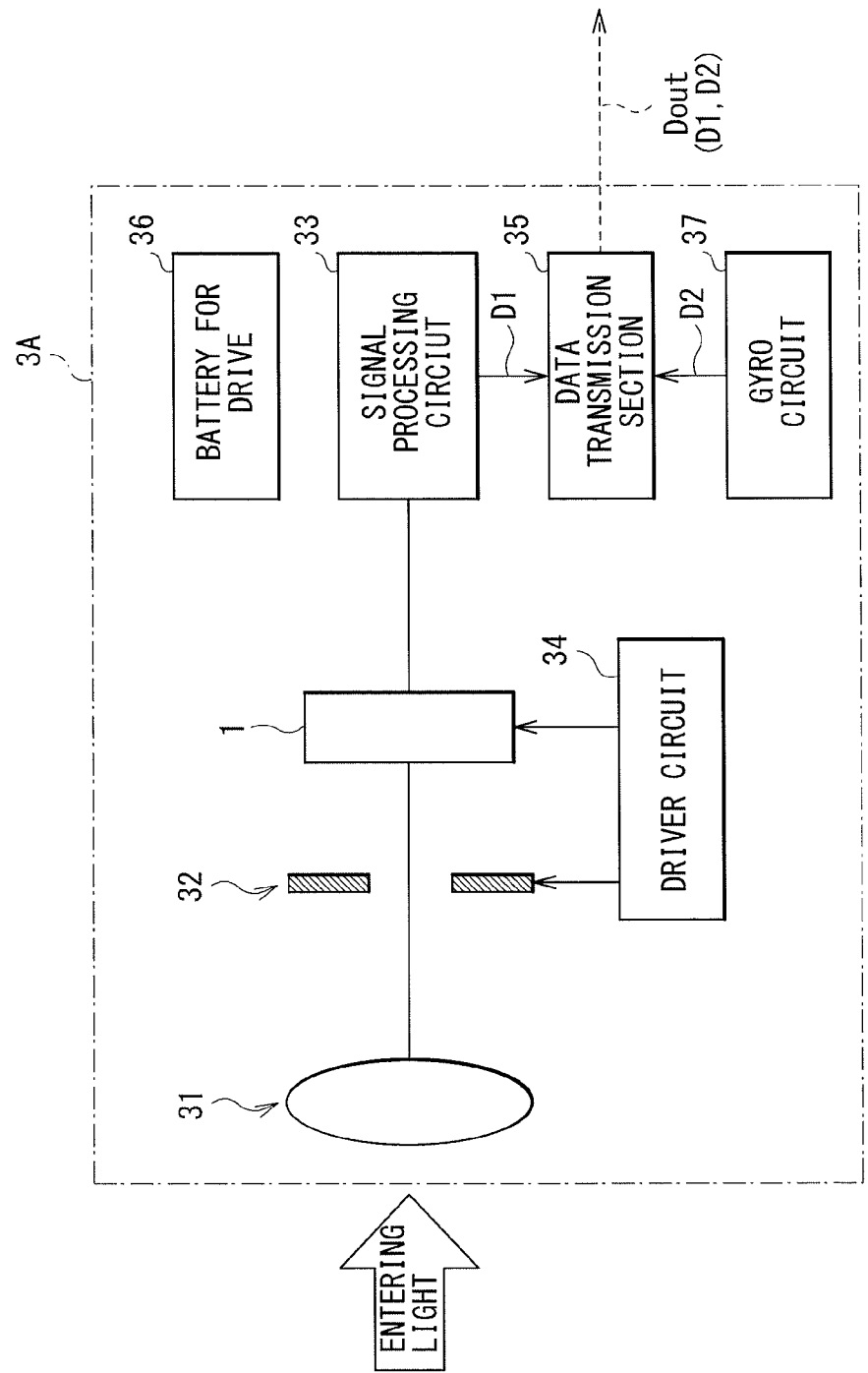
FIG. 13 is a functional block diagram illustrating an overall configuration according to an application example 2 (a capsule endoscope camera).

FIG. 13 is a functional block diagram illustrating an overall configuration of an endoscope camera (a capsule endoscope camera 4A) according to a modification example 2. The capsule endoscope camera 4A may include an optical system 41, a shutter device 42, the image sensor 1, a driver circuit 44, a signal processing circuit 43, a data transmission section 45, a battery for drive 46, and a gyro circuit 47 for posture (direction and angle) sensing. Among these, the optical system 41, the shutter device 42, the driver circuit 44, and the signal processing circuit 43 may have similar functions to those of the optical system 21, the shutter device 22, the driver circuit 24, and the signal processing circuit 24 described in the forgoing imaging device 2. However, the optical system 41 may be desirably able to photographing in a plurality of directions (for example, in all directions) in four-dimensional space, and may be configured of one or more lenses. However, in the present example, a picture signal D1 after signal processing in the single processing circuit 43 and a posture sensing signal D2 outputted from the gyro circuit 47 may be transmitted to an external device by radio communication through the data transmission section 45.

Figure 14:
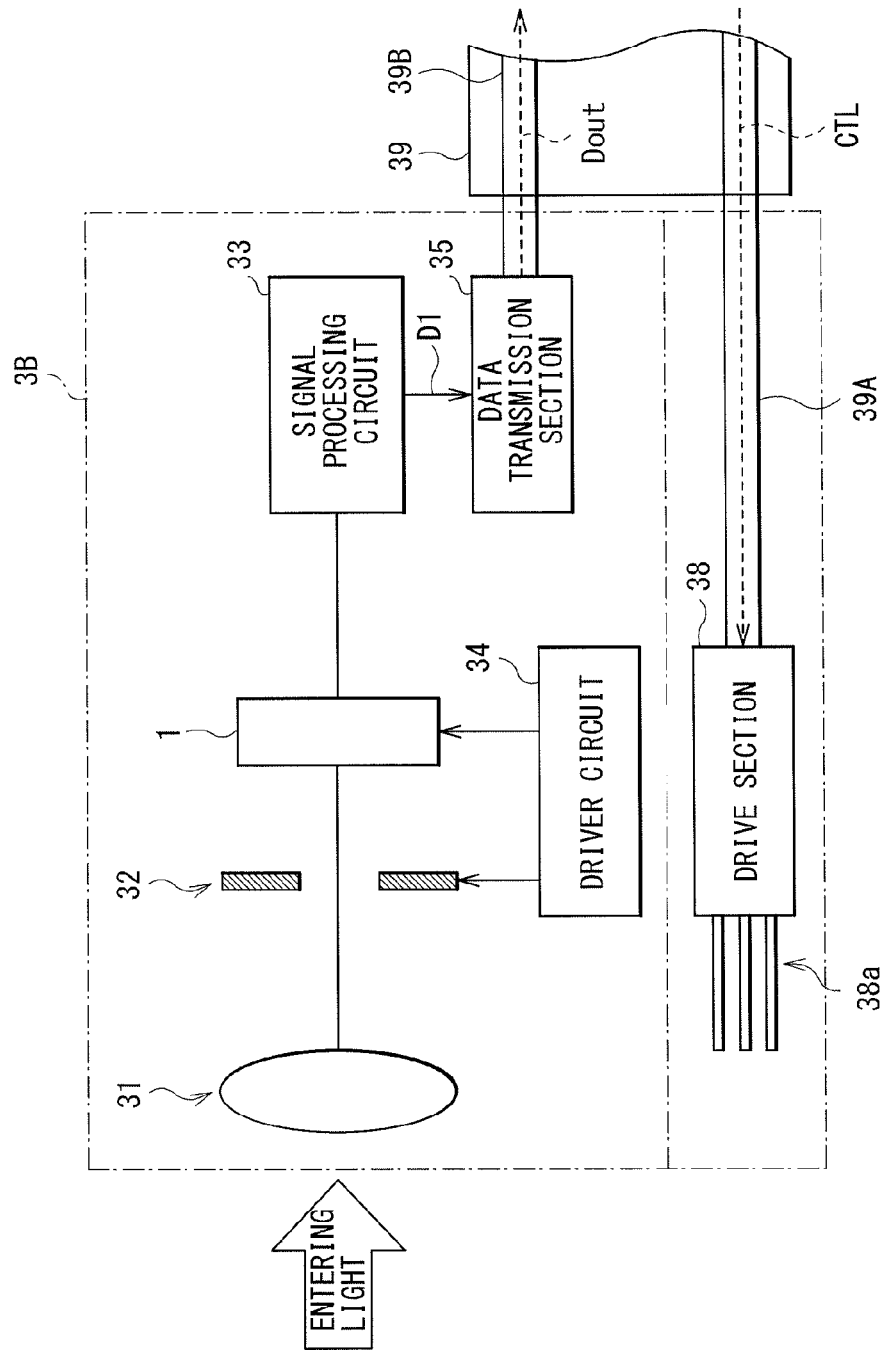
FIG. 14 is a functional block diagram illustrating an overall configuration according to another example of an endoscope camera (an insertion endoscope camera).

It is to be noted that an endoscope camera to which the image sensor in the forgoing embodiments may be applied is not limited to a capsule type as described above, but may be, for example, an insertion endoscope camera (an insertion endoscope camera 4B) as illustrated in FIG. 14. The insertion endoscope camera 4B may include the optical system 41, the shutter device 42, the image sensor 1, the driver circuit 44, the signal processing circuit 43, and the data transmission section 45, similarly to the configuration of part of the forgoing capsule endoscope camera 4A. However, the insertion endoscope camera 4B may further include an arm 48a and a driver section 48. The arm 48a may be storable inside the device. The driver section 48 is configured to drive the arm 48a. The insertion endoscope camera 4B thus configured may be coupled to a cable 49. The cable 49 may include a wiring 49A and a wiring 49B. The wiring 49A is configured to transmit an arm control signal CTL to the driver section 48. The wiring 49B is configured to transmit the picture signal Dout based on a photographed image.

Application Example 3

Figure 15:
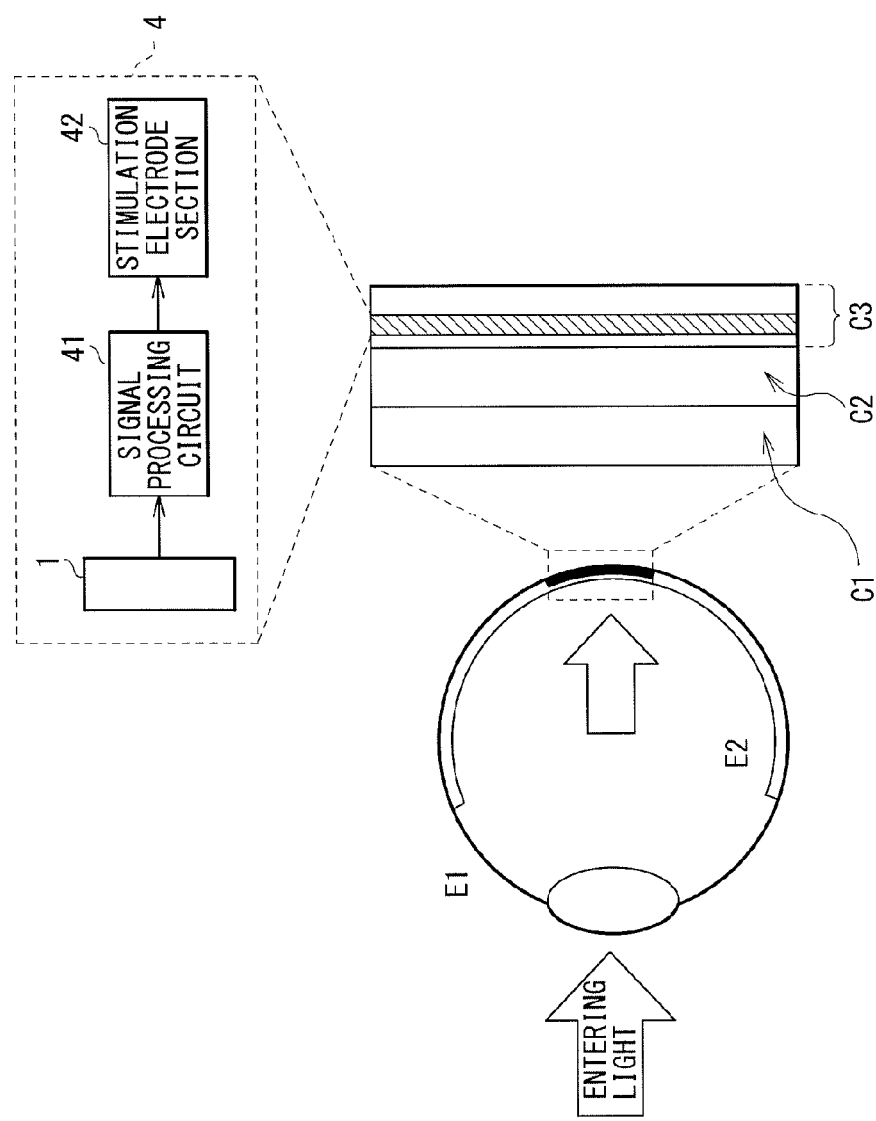
FIG. 15 is a functional block diagram illustrating an overall configuration according to an application example 3 (a vision chip).

FIG. 15 is a functional block diagram illustrating an overall configuration of a vision chip (a vision chip 5) according to an application example 3. The vision chip 5 may be an artificial retina embedded for use in part of an inner wall (a retina E2 including optic nerve) of an eyeball E1 of an eye. The vision chip 5 may be embedded in, for example, part of one of a gangliocyte C1, a horizontal cell C2, and a visual cell C3 in the retina E2, and may include, for example, the image sensor 1, a signal processing circuit 51, and a stimulation electrode section 52. Thus, an electrical signal based on entering light in an eye may be obtained in the image sensor 1. By processing the electrical signal in the signal processing circuit 51, a predetermined control signal may be supplied to the stimulation electrode section 52. The stimulation electrode section 52 may have a function of giving a stimulus (an electrical signal) to the optical nerve in response to the control signal inputted.

Application Example 4

Figure 16:
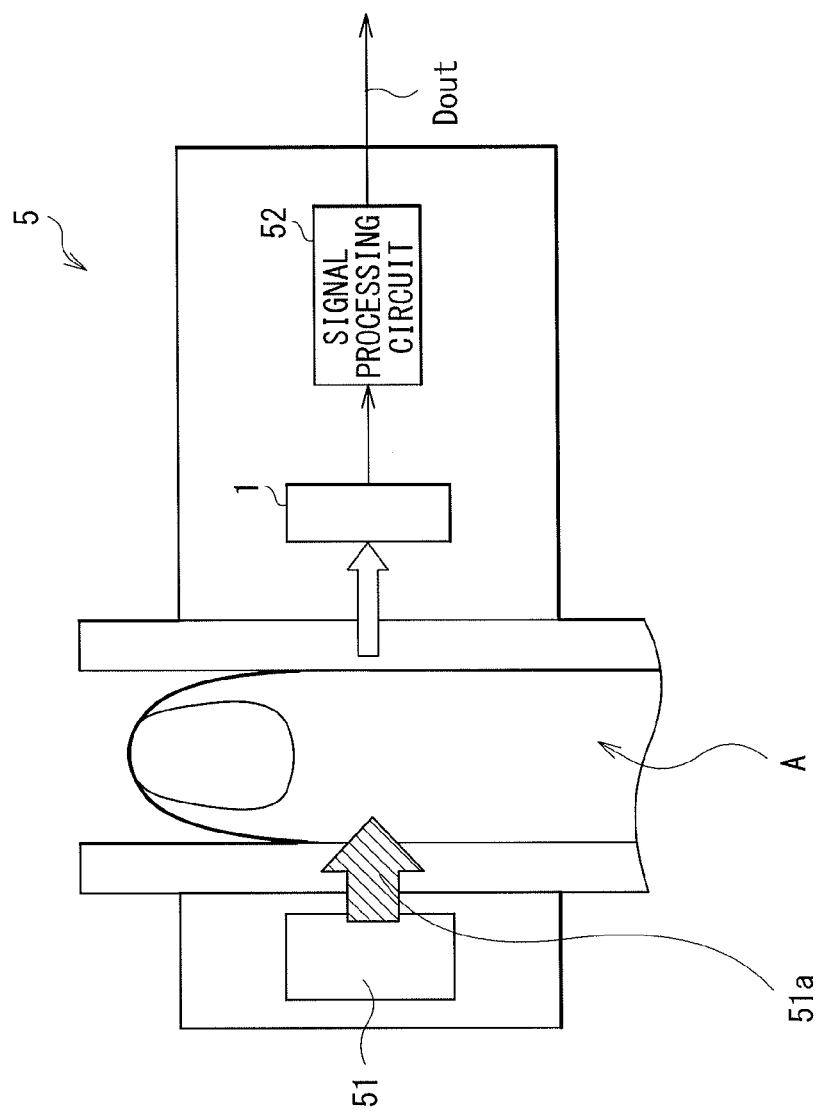
FIG. 16 is a functional block diagram illustrating an overall configuration according to an application example 4 (a biosensor).

FIG. 16 is a functional block diagram illustrating an overall configuration of a biosensor (a biosensor 6) according to an application example 4. The biosensor 6 may be, for example, a blood sugar level sensor fittable to a finger A, and may include a semiconductor laser 61, the image sensor 1, and a signal processing circuit 62. The semiconductor laser 61 may be, for example, an IR laser (an infrared laser) configured to emit infrared light (with a wavelength of 780 nm or more). With this configuration, degree of laser light absorption in accordance with a blood glucose content may be sensed by the image sensor 1 for measurement of a blood sugar level.

Although description has been made by giving the first and second embodiments and the modification examples 1 to 3 as mentioned above, the contents of the present disclosure are not limited to the above-mentioned example embodiments, etc. and may be modified in a variety of ways. For example, in the above-described example embodiments, etc., the light condensing section 10 is configured of the on-chip lens 11 and the color filter 12. However, a planarization film to planarize the light receiving surface 20S or an antireflection coating may be formed between the color filter 12 and the light receiving section 20.

It is to be noted that the contents of the present technology may have the following configurations.

(1)

An imaging element, including:

a first pixel and a second pixel each including a light receiving section and a light condensing section, the light receiving section including a photoelectric conversion element, and the light condensing section configured to allow entering light to be condensed toward the light receiving section;

a trench provided between the first pixel and the second pixel;

a first light shielding film embedded in the trench; and a second light shielding film provided on part of a light receiving surface of the light receiving section of the second pixel, the second light shielding film being continuous with the first light shielding film.

(2)

The imaging element according to (1), wherein the second light shielding film is provided on the light receiving surface of the light receiving section.

(3)

The imaging element according to (1), wherein the second light shielding film is embedded in the light receiving section.

(4)

The imaging element according to any one of (1) to (3), wherein the first pixel and the second pixel allow respective entering light to be condensed at a same level in a depthwise direction.

(5)

The imaging element according to any one of (1) to (4), wherein the light receiving section includes an n-type semiconductor region and a p-type semiconductor region, the n-type semiconductor region serving as the photoelectric conversion element, and the p-type semiconductor region provided on the light receiving surface and extending from a wall surface to a bottom surface of the trench.

(6)

The imaging element according to any one of (1) to (5), wherein the light receiving surface of the light receiving section and the wall surface and the bottom surface of the trench are covered with a continuous fixed charge film.

(7)

The imaging element according to any one of (1) to (6), including a first region and a second region, the first region including the first pixel and the second pixel, and the second region provided around the first region and shielded from light by a third light shielding film, wherein the third light shielding film is configured of a same material as a material of the second light shielding film.

(8)

The imaging element according to any one of (1) to (7), wherein the light condensing section includes a lens that serves as an optical function layer, and the lens in the first pixel and the lens in the second pixel are of a same shape.

(9)

The imaging element according to (8), wherein the light receiving section of the first pixel and the light receiving section of the second pixel each faces the lens.

(10)

The imaging element according to (8) or (9), further including an inner lens provided between the lens and the light receiving section.

(11)

The imaging element according to any one of (1) to (10), wherein the light condensing section includes a color filter in red, green, blue, or white, and the light condensing section of the second pixel includes the color filter in green or white.

(12)

The imaging element according to any one of (1) to (11), wherein the first pixel and the second pixel serve as imaging plane phase difference detection pixels disposed adjacent to each other.

(13)

An imaging device provided with an imaging element, the imaging element comprising:

a first pixel and a second pixel each including a light receiving section and a light condensing section, the light receiving section including a photoelectric conversion element, and the light condensing section configured to allow entering light to be condensed toward the light receiving section;

a trench provided between the first pixel and the second pixel;

a first light shielding film embedded in the trench; and a second light shielding film provided on part of a light receiving surface of the light receiving section of the second pixel, the second light shielding film being continuous with the first light shielding film.

This application claims the benefit of Japanese Priority Patent Application JP 2013-73532 filed on Mar. 29, 2013 the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging element comprising:
    a pixel region including:
        a first pixel and a second pixel each including a light-receiving section and a light-condensing section, the light-receiving section including a photoelectric conversion element, and the light-condensing section configured to allow entering light to be condensed toward the light-receiving section, and
        a light-shielding film; and
    a peripheral region provided around the pixel region including another light-shielding film,
    wherein a first part of the light-shielding film is embedded in a trench provided between the first pixel and the second pixel,
    wherein a second part of the light-shielding film is provided on part of a light-receiving surface of the light-receiving section of the second pixel, and
    wherein the another light-shielding film is configured of a same material as a material of the light-shielding film.

2. The imaging element according to claim 1, wherein the light-condensing section includes a lens that serves as an optical function layer, and the lens in the first pixel and the lens in the second pixel are of a same shape.

3. The imaging element according to claim 2, wherein each of the light-receiving section of the first pixel and the light-receiving section of the second pixel faces the respective lens.

4. The imaging element according to claim 2, further comprising an inner lens provided between the lens and the light-receiving section.

5. The imaging element according to claim 1, wherein the light-condensing section includes a red, green, blue, or white color filter, and the light-condensing section of the second pixel includes the green or white color filter.

6. The imaging element according to claim 1, wherein the first pixel and the second pixel serve as imaging plane phase difference detection pixels disposed adjacent to each other.

7. An imaging device provided with the imaging element according to claim 1.

8. An imaging element comprising:
a pixel region including:
- a first pixel and a second pixel each including a photoelectric conversion element, a lens, and an inner lens provided between the lens and the photoelectric conversion element, and
- a light-shielding film, wherein a first part of the light-shielding film is embedded in a trench provided between the first pixel and the second pixel, and wherein a second part of the light-shielding film is provided on part of a light-receiving surface of a light-receiving section of the second pixel.

9. An imaging device provided with the imaging element according to claim 8.

* * * * *